United States Patent [19]

Suzuki et al.

[11] 4,291,274

[45] Sep. 22, 1981

[54] PHASE DETECTOR CIRCUIT USING LOGIC GATES

[75] Inventors: Yasoji Suzuki, Ayase; Nobuyuki Kamimaru, Yokohama, both of Japan

[73] Assignee: Tokyo Shibaura Denki Kabushiki Kaisha, Kawasaki, Japan

[21] Appl. No.: 96,056

[22] Filed: Nov. 20, 1979

[30] Foreign Application Priority Data

Nov. 22, 1978 [JP] Japan ............................. 53-144611
Jun. 29, 1979 [JP] Japan ............................. 54-81459

[51] Int. Cl.³ .................. H03D 13/00; H03K 5/26
[52] U.S. Cl. ........................... 328/133; 328/134; 307/516; 307/526; 307/528
[58] Field of Search ................ 328/133, 134; 307/232

[56] References Cited

U.S. PATENT DOCUMENTS

| 3,599,102 | 8/1971 | Mous | 328/133 |
| 3,610,954 | 10/1971 | Treadway | 307/232 |
| 3,755,746 | 8/1973 | Hogue et al. | 328/133 |
| 4,027,262 | 5/1977 | Sharpe | 328/133 |
| 4,090,143 | 5/1978 | Merrell | 328/134 |

Primary Examiner—John S. Heyman
Attorney, Agent, or Firm—Oblon, Fisher, Spivak, McClelland & Maier

[57] ABSTRACT

A phase detector circuit having four dominant type flip-flop circuits and at least one logic gate. The phase detector circuit is responsive to changes of two input signals, and produces output signals related to the relative phase of the input signals having duty cycle. The output signals have a predetermined level only for the period the phases of the input signals differ. When the phases of the input signals are the same, the output signals of the phase detector circuit will be at another level.

5 Claims, 49 Drawing Figures

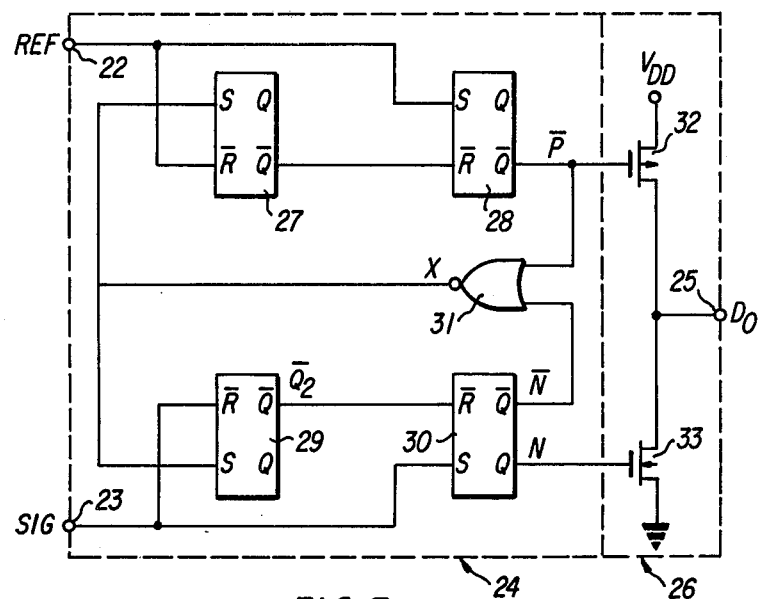
FIG.7
| S | 0 | 0 | 1 | 1 |
|---|---|---|---|---|
| R | 0 | 1 | 0 | 1 |
| $Q_n$ | $Q_{n-1}$ | 0 | 1 | 0 |
| $\bar{Q}_n$ | $\bar{Q}_{n-1}$ | 1 | 0 | 1 |
FIG.8
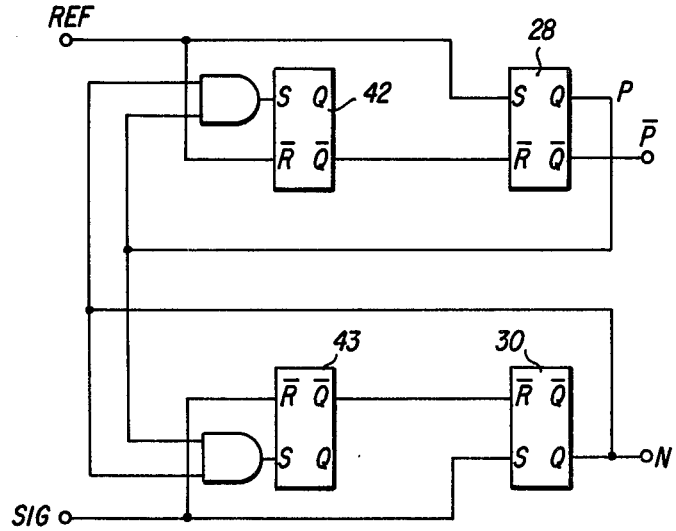
FIG.13

PHASE DETECTOR CIRCUIT USING LOGIC GATES

BACKGROUND OF THE INVENTION

1. Field of the Invention

This invention relates to a phase detector circuit for detecting the relative phase difference between two input signals.

2. Description of the Prior Art

Many applications of phase comparator or phase detector circuits utilize a feedback or servo system for locking the phase and frequency of one input to the phase and frequency of the other input which constitutes the reference signal in the system. An application is shown in FIG. 1 wherein it is illustrated that a phase detector circuit is utilized as a phase-locked-loop circuit. A phase detector circuit (1) compares the phase of an input signal $S_{ig}$ with the phase of a reference signal $R_{ef}$, and produces an output signal related to the phase difference of the two signals. This output signal is transferred to a charge pump (2). The charge pump (2) responds to the output signal of the phase detector circuit and produces a control signal. The control signal is changed to a direct current by a low pass filter (3). The signal changed to the direct current controls the frequency of the output signal of a voltage-controlled oscillator (4). The frequency $f_v$ of the output signal of the voltage-controlled oscillator (4) is the output frequency $f_o$ of this system. The signal having the frequency $f_v$ is applied to a programmable divider (5), and the signal, which is derived from the programmable divider (5) having programmed dividing ratio N, is applied to the phase detector circuit (1). Thus, an output signal having the stable frequency $f_o$ can be derived from the phase-locked-loop circuit.

A circuit diagram of the phase detector circuit (1) and the charge pump (2) is shown in FIG. 2. FIG. 3 contains waveforms illustrating the operation of the circuit shown in FIG. 2. In FIG. 2, the reference signal $R_{ef}$ and the input signal $S_{ig}$ are applied to the phase detector circuit (1). Two inverters (6) and (7) invert the two signals. The output signal $\overline{R_{ef}}$ of the inverter (6) is applied at the set input terminal of a flip-flop circuit (8) and the output signal $\overline{S_{ig}}$ of the inverter (7) is applied at the set input terminal of a flip-flop circuit (9). The Q output signals $S_1$ and $S_2$ of the flip-flop circuits (8) and (9) are applied at the set input terminals of flip-flop circuits (10) and (11), respectively. The Q output signal $S_1$ and $S_2$ are also applied to a NAND gate 12. The NAND gate (12) has additional input terminals for receiving the output signals of the flip-flop circuits (10) and (11). The output signal of the NAND gate (12) is applied to AND gates of the flip-flop circuits (8) and (9) and resets the input terminals of the flip-flop circuits (10) and (11). The $\overline{Q}$ output signals P and N are applied to an AND gate (13). The $\overline{Q}$ output signals P and N become the output signals of the phase detector circuit (1). The output signals P and N of the phase detector circuit (1) are applied to the charge pump (2).

The charge pump (2) is constructed of a P-channel MOS transistor (14) and a N-channel MOS transistor (15) connected in series between a power supply $V_{DD}$ and ground. An inverter (16) is connected to the gate of the transistor (15) in order to provide a predetermined logic signal. The gate of the transistor (14) receives the output signal P of the flip-flop circuit (8) and the inverter (16) receives the output signal N of the flip-flop circuit (9). The charge pump (2) produces an output signal $D_o$ in response to the output signals of the phase detector circuit (1).

As shown in FIG. 3, when the phase of the input signal $S_{ig}$ is delayed more than the phase of the reference signal $R_{ef}$, the $\overline{Q}$ output signal P of the flip-flop circuit (8) becomes ground level when the phase is delayed. When the phase of the input signal $S_{ig}$ is advanced as compared to the reference signal $R_{ef}$, the $\overline{Q}$ output signal N of the flip-flop circuit (9) becomes ground level during this period. Consequently, the output signal $D_o$ of the charge pump (2) becomes the power supply level $V_{DD}$ during the period when the input signal $S_{ig}$ is delayed as compared to the reference signal $R_{ef}$ and becomes the ground level $V_{ss}$ during the period when the input signal $S_{ig}$ is advanced as compared to the reference signal $R_{ef}$. Further, as illustrated in FIG. 3, when the phase of the input signal $S_{ig}$ is equal to that of the reference signal $R_{ef}$, the output signal $D_o$ goes to a high impedance state.

The output signal LD of the AND gate (13) of the phase detector circuit (1) goes to ground level during the period that the phase of the input signal $S_{ig}$ is delayed or advanced as compared to the reference signal $R_{ef}$, as illustrated in FIG. 3. The charge pump (2) in this circuit operates as a tristate buffer circuit (i.e., the output signal of the charge pump (2) will be the power supply level, the ground level or the high impedance state). In the phase-locked-loop circuit, this signal is transferred to the low pass filter.

FIG. 4 shows a logic diagram of the phase detector circuit illustrated in FIG. 2 and the numbers and marks in FIG. 4 correspond to those in FIG. 2. Further, a NAND gate which has two input terminals (17) and (18) is shown in FIG. 5 and it is constructed by complementary MOS transistors. The NAND gate produces at an output terminal (19) the signal of a power supply $V_{DD}$ level (high level) only when all input signals are high level. An inverter constructed by complementary MOS transistors is shown in FIG. 6. In this inverter, the input signal to the input terminal (20) is inverted and an inverted signal is produced at the output terminal (21).

Generally, if a logic gate is constructed by complementary MOS transistors, two MOS transistors are required for one input signal. The NAND gate in FIG. 5 requires four transistors for two input signals and the inverter requires two transistors for one input signal.

If the circuit in FIG. 4 is constructed by complementary MOS transistors, forty-eight transistors would be required.

Thus, the conventional circuit has disadvantages in that the transistors increase in number and the area where the circuit is formed becomes larger. Further, in the conventional circuit, as the two output signals of the flip-flop circuits (8) and (9) aren't in an inverse relationship with respect to each other, the inverter (16) is needed in order to obtain the signal N required in the charge pump (2). Thus, the transistors are further increased in number.

SUMMARY OF THE INVENTION

Accordingly, an object of the invention is to provide a phase detector circuit which can be constructed by less transistors than a prior phase detector circuit.

Another object of the invention is to provide a phase detector circuit which is simple in construction, and has the same function as a prior phase detector circuit.

Another object of the invention is to provide a phase detector circuit which can be constructed by less logic gates than a prior phase detector circuit.

Another object of the invention is to provide a phase detector circuit which can be designed under less restrictions.

According to the invention, there is provided a phase detector circuit comprising two input terminals at which input signals are applied, two output terminals at which output signals relative to the phases of the input signals are produced, first dominant type flip-flop circuit connected to one input terminal and whose output signal is transferred to one output terminal, second dominant type flip-flop circuit connected to the other input terminal and whose output signal is transferred to the other input terminal, third flip-flop circuit connected to the one input terminal and whose output signal is transferred to the first dominant type flip-flop circuit, fourth flip-flop circuit connected to the other input terminal and whose output signal is transferred to the second dominant type flip-flop circuit, gate means receiving the output signals of the first and second dominant type flip-flop circuits and whose output signal is applied to the third and second flip-flop circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein;

FIG. 7 is a logic diagram of an embodiment of the invention;

FIG. 8 is a truth table of a reset dominant type flip-flop circuit;

FIG. 13 is a logic diagram of another embodiment of the invention;

FIG. 35 and FIGS. 37-49 are logic diagrams of other embodiments of the invention.

DETAILED DESCRIPTION OF THE PREFERRED EMBODIMENT

Figure 1:
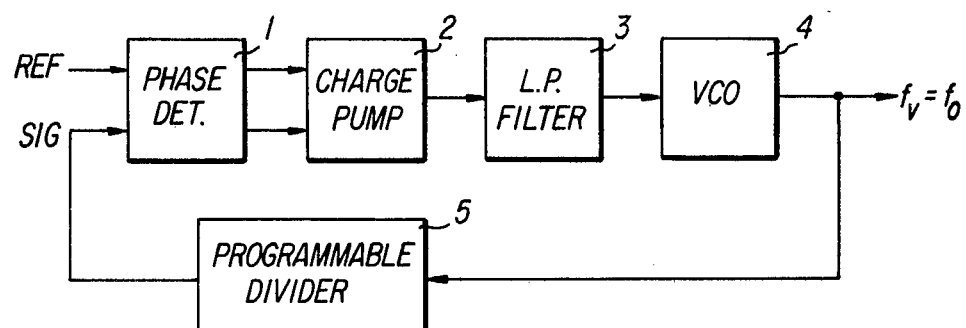
FIG. 1 is a block diagram of a phase-locked-look circit.

Referring to the drawings, wherein like reference numerals and marks designate identical or corresponding parts throughout the several views, and more particularly to FIG. 7 thereof, an input signal $S_{ig}$ and a reference signal $R_{ef}$ are, respectively, applied to input terminals (22) and (23) of the phase detector circuit (24) and the output signal $D_o$ related to the phase difference between the two signals $S_{ig}$ and $R_{ef}$ is produced at an output terminal (25) of a charge pump (26). The reference signal $R_{ef}$ is applied at the reset input terminal of a reset dominant R-S type flip-flop circuit (27) and at the set input terminal of a reset dominant R-S type flip-flop circuit (28). The input signal $S_{ig}$ is applied at the reset input terminal of a reset dominant R-S type flip-flop circuit (29) and at the set input terminal of a reset dominant R-S type flip-flop circuit (30). The $\overline{Q}$ output signals $\overline{Q1}$ and $\overline{Q2}$ of the flip-flop circuits (27) and (29) are, respectively, applied to the reset input terminals of the flip-flop circuits (28) and (30). The $\overline{Q}$ output signals $\overline{P}$ and $\overline{N}$ are applied to NOR gate (31) whose output is applied to the set input terminal of the flip-flop circuits (27) and (29). The output signals $\overline{P}$ and N of the phase detector circuit (24) are produced, respectively, at the $\overline{Q}$ output terminal of the flip-flop circuit (28) and the Q output terminal of the flip-flop circuit (30). The output signal $\overline{P}$ is applied to a P channel MOS transistor (32) and the output signal N is applied to a N channel MOS transistor (33). The output signal $D_o$ of the charge pump (26) is produced in response to the output signals $\overline{P}$ and N of the phase detector circuit (24).

Now, all of the flip-flop circuits (27), (28), (29) and (30) are reset dominant type flip-flop circuits which will be reset when the level of the reset input signal is changed from "1" level to "0" level. The truth table for the reset dominant type flip-flop circuit is shown in FIG. 8. In the normal flip-flop circuit, the level of the output signals Q and $\overline{Q}$ will not be determined when the level of the set input signal and the reset input signal are "1" level. But, in the reset dominant type flip-flop circuit, when the level of the set and reset input signals are "1" level, the reset input signal will be dominant to the set input signal. So, an inverted reset input signal will be produced at the Q output terminal of the flip-flop circuit and the other output signal will always be inverse to said one output signal. Thus, as the reset dominant type flip-flop circuits produce output signals which are inverted with respect to each other, the circuit for changing the logic can be removed and the circuit is simpler than the conventional circuit.

The reset dominant type flip-flop circuit is used in this embodiment but the set dominant type flip-flop circuit can be used in a similar manner. In this case, when the level of the two input signals is "1" level, the set input signal is dominant and the set input signal is generated at the Q output terminal.

In FIG. 7, the input terminals of each flip-flop circuit are illustrated as S for the set input and $\overline{R}$ for the inverted reset input.

Figure 9:
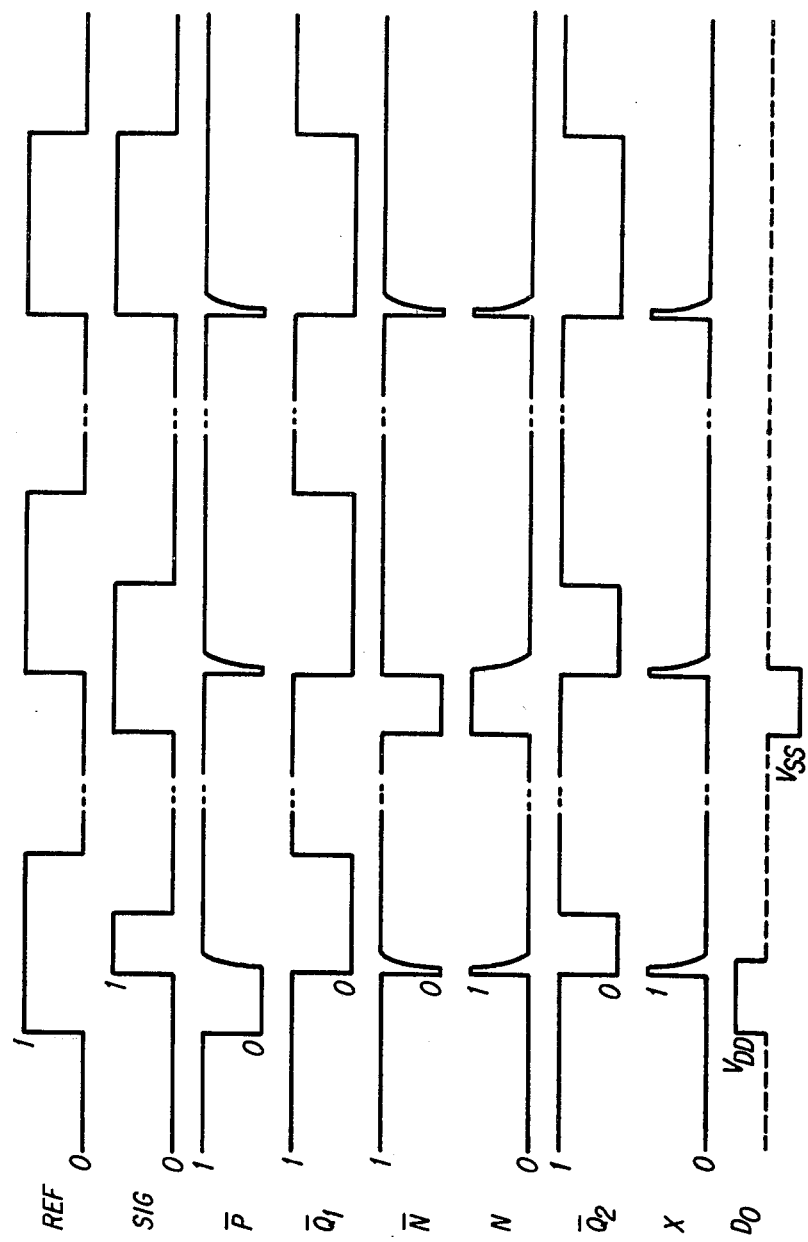
FIG. 9 shows waveforms for illustrating the operation of the circuit in FIG. 7.

Next, the operation of the phase detector circuit 24, in FIG. 7, is as follows. In FIG. 9, when the level of the reference signal $R_{ef}$ and the input signal $S_{ig}$ is "0" level it is supposed that the flip-flop circuits (27), (28), (29) and (30) are reset. So, the level of the signals $\overline{P}$, $\overline{Q1}$, $\overline{N}$ and $\overline{Q2}$ is a "1" level and that of the signal N is "0" level. Then, the output signal X of the NOR gate (31) is "0" level. Next, when the reference signal $R_{ef}$ becomes "1" level, the flip-flop circuit (27) will be set. Then, the signal $\overline{P}$ goes down to "0" level. This cuts the transistor (32) off and raises the output signal $D_o$ of the charge pump (26) to the power supply level $V_{DD}$. When the signal $\overline{N}$ goes down at "0" level, the output signal X of the NOR gate rises "1" level. When the output signal X rises to a "1" level, the flip-flop circuits (27) and (29) are set and the $\overline{Q}$ output signals $\overline{Q1}$ and $\overline{Q2}$ go down to "0" level. This resets the flip-flop circuits (28) and (30), and the output signal $\overline{P}$ of the flip-flop circuit (28) rises to "1" level and the output signal $\overline{N}$ of the flip-flop circuit (30) rises to "1" level. On the contrary, the output signal N goes down to "0" level. When the signals $\overline{P}$ and $\overline{N}$ rose to "1" level, the output signal X of the NOR gate (31) went down to "0" level. Thus, this cuts the transistor (32) off and places the output signal $D_o$ of the charge pump (26) back to a normal state.

As the series of operations is done in a moment, the time period that the signal N is "1" level and the signal $\overline{P}$ is "0" level is very short. So, the output signal $D_o$ doesn't become ground level.

Thus, the output signal $D_o$ is a signal that is relative to the phase difference of the two signals $R_{ef}$ and $S_{ig}$.

Next, when the signal $S_{ig}$ goes down to "0" level, the flip-flop circuit (29) becomes reset and the $\overline{Q}$ output signal $\overline{Q2}$ rises to "1" level. Further, when the signal $R_{ef}$ goes down to "0" level, the flip-flop circuit becomes reset and the $\overline{Q}$ output signal $\overline{Q1}$ rises to "1" level.

Next, an explanation for the case wherein the signal $S_{ig}$ rises to a "1" level before the signal $R_{ef}$ rises to "1" level is given. In that condition, the flip-flop circuit (30) becomes set and then the output signal N rises to "1" level and the output signal $\overline{N}$ goes down to "0" level. This cuts the transistor (33) on and drops the output signal $D_o$ to "0" level. When the signal $R_{ef}$ rises to "1" level, the flip-flop circuit (28) is set and the output signal $\overline{P}$ goes down to "0" level. As the signal $\overline{N}$ is already "0" level, the output signal X of the NOR gate (31) will rise to "1" level. Then, as the signals $R_{ef}$ and $S_{ig}$ are both "1" level, the flip-flop circuits (27) and (29) will be set. When the flip-flop circuits (27) and (29) are set, both of the signals $\overline{Q1}$ and $\overline{Q2}$ go down to "0" level. This resets the flip-flop circuits (28) and (30). The output signal $\overline{P}$ of the flip-flop circuit (28) rises to "1" level and the output signal N goes down to "0" level and the output signal $\overline{N}$ rises to "1" level. This cuts the transistor (33) off and brings the output signal $D_o$ back to the normal state. As these operations are completed in a moment, the time period that the signal $\overline{P}$ is "0" level and the signal N is "1" level is very short.

So, the output signal $D_o$ of the charge pump (26) doesn't become $V_{DD}$ level even if the output signal $\overline{P}$ becomes "0" level. Thus, when the phase of the signal $S_{ig}$ goes ahead of that of the signal $R_{ef}$ the output signal $D_o$ becomes ground level. After that, the signal $S_{ig}$ goes down to "0" level. As the flip-flop circuit (29) is reset, the output signal $\overline{Q2}$ rises to "1" level. Further, when the signal $R_{ef}$ goes down to "0" level, the flip-flop circuit (27) is reset and the output signal $\overline{Q1}$ rises to "1" level.

Next, when the signals $R_{ef}$ and $S_{ig}$ rise to "1" level simultaneously, the flip-flop circits (28) and (30) are set. Then, the output signal $\overline{P}$ goes down to "0" level and the output signal N rises to "1" level and the output signal $\overline{N}$ goes down to "0" level. As the signals $\overline{P}$ and $\overline{N}$ go down to "0" level, the output signal X of the NOR gate (31) rises to "1" level and the flip-flop circuits (27) and (29) are set simultaneously. This makes the output signals $\overline{Q1}$ and $\overline{Q2}$ go down to "0" level. So, as the flip-flop circuits (28) and (30) are reset, the output signal $\overline{P}$ rises to "1" level and the output signal N goes down to "0" level. Conversely, the output signal $\overline{N}$ rises to "1" level. After that, the output signal X goes down to "0" level. As these operations are completed in a moment, the time period that the signals $\overline{P}$ and N are, respectively, "0" level and "1" level is very short. So, the output signal $D_o$ holds the high impedance state.

Later, when the signals $R_{ef}$ and $S_{ig}$ both go down to "0" level simultaneously, both of the flip-flop circuits (27) and (29) are reset. Then, the output signals $\overline{Q1}$ and $\overline{Q2}$ rise to "1" level. If the signals $R_{ef}$ and $S_{ig}$ have the same with respect to each other, the signals $\overline{P}$ and $\overline{N}$ are held at "1" level and "0" level, respectively.

Figure 6:
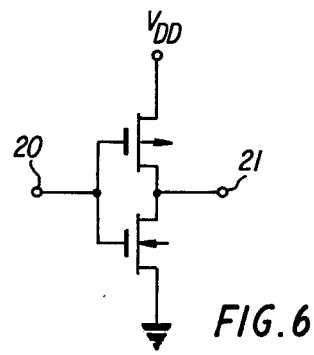
FIG. 6 is a transistor circuit diagram of an inverter.
Figures 11, 12:
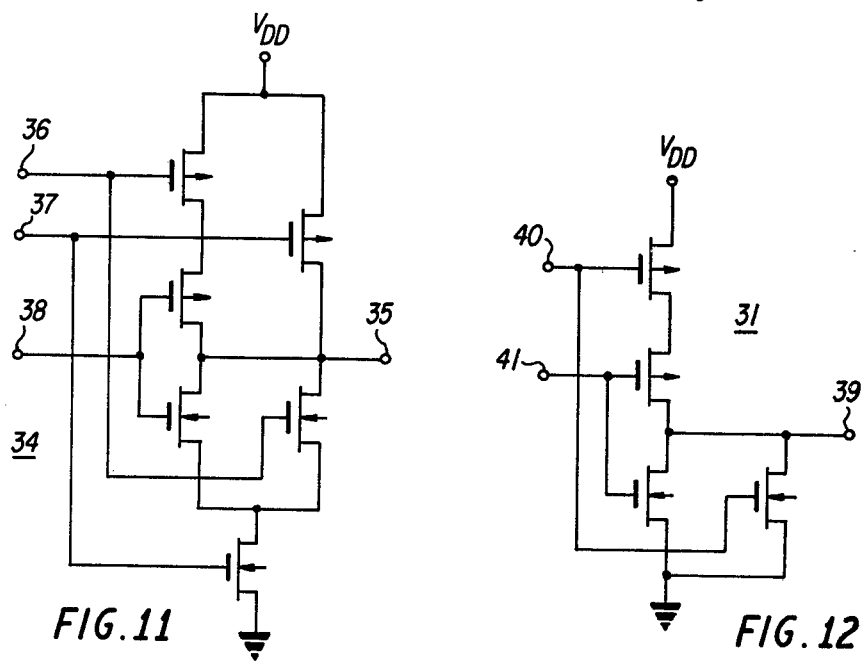
FIG. 11 is a transistor circuit diagram of the logic gate used in the circuit in FIG. 10.
FIG. 12 is a transistor circuit diagram of a NOR gate.
Figure 10:
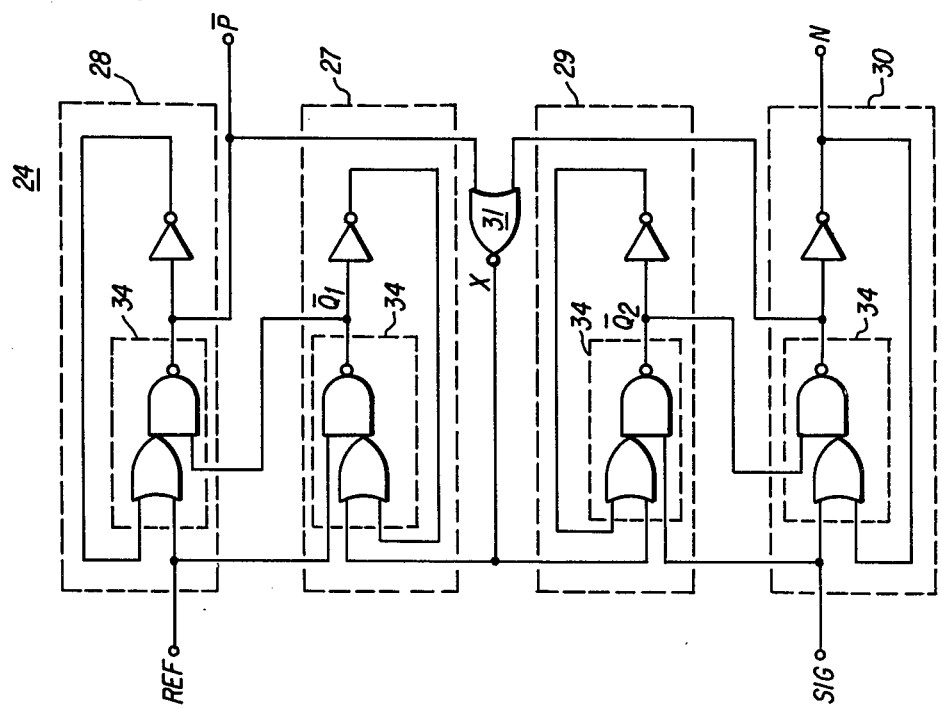
FIG. 10 is a concrete logic diagram of a logic circuit shown in FIG. 7.

FIG. 10 is a concrete logic diagram of the logic diagram shown in FIG. 7. This logic circuit is constructed by using several logic gates. The logic gate (34) of this FIGURE can be constructed by complementary MOS transistors shown in FIG. 11. In the circuit of FIG. 11, an output signal at an output terminal (35) is obtained in response to the input signals at the input terminals of the OR gates of the logic gate (34) and the input signal at the input terminals of the NAND gates of the logic circuit (34). The NOR gate (31) of FIG. 11 can be constructed by complementary MOS transistors shown in FIG. 12. In this circuit, a signal at the output terminal (39) is obtained in response to the signals at the input terminals (40) and (41). The transistor circuit of the inverters illustrated in FIG. 10 are shown in FIG. 6.

When the flip-flop circuits (27), (28), (29) and (30) are constructed by complementary MOS transistors, each flip-flop circuit is constructed of 8 transistors. Thus, the phase detector circuit 24, in FIG. 10, can be constructed by thirty-six transistors.

Accordingly, the phase detector circuit of this invention can be constructed of fewer transistors than the conventional circuit. Moreover, the circuit of this invention is simpler.

Figure 2:
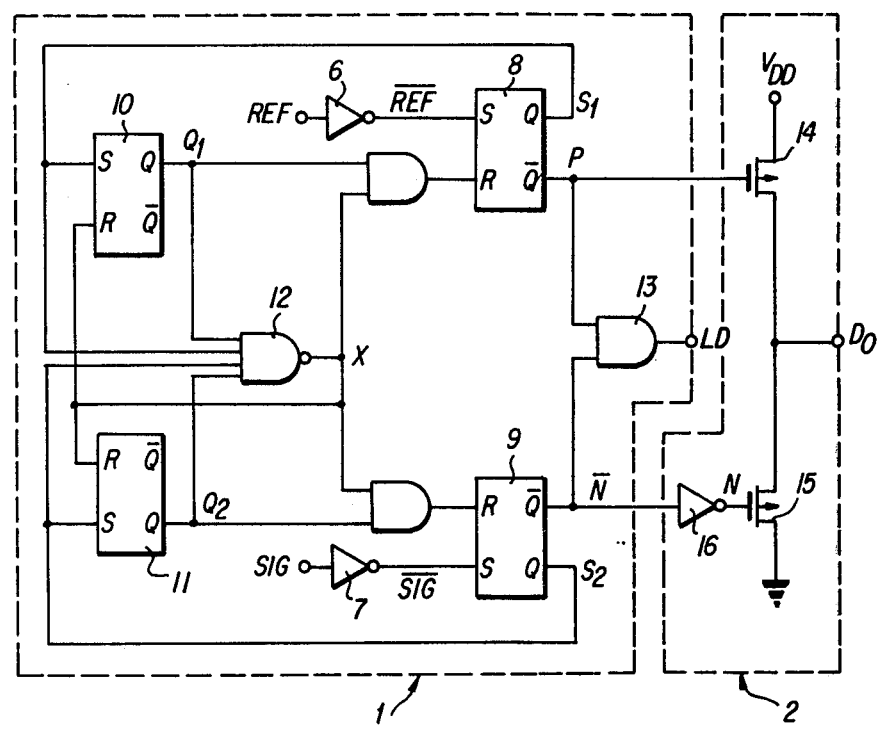
FIG. 2 is a logic diagram of a conventional phase detector circuit.
Figure 3:
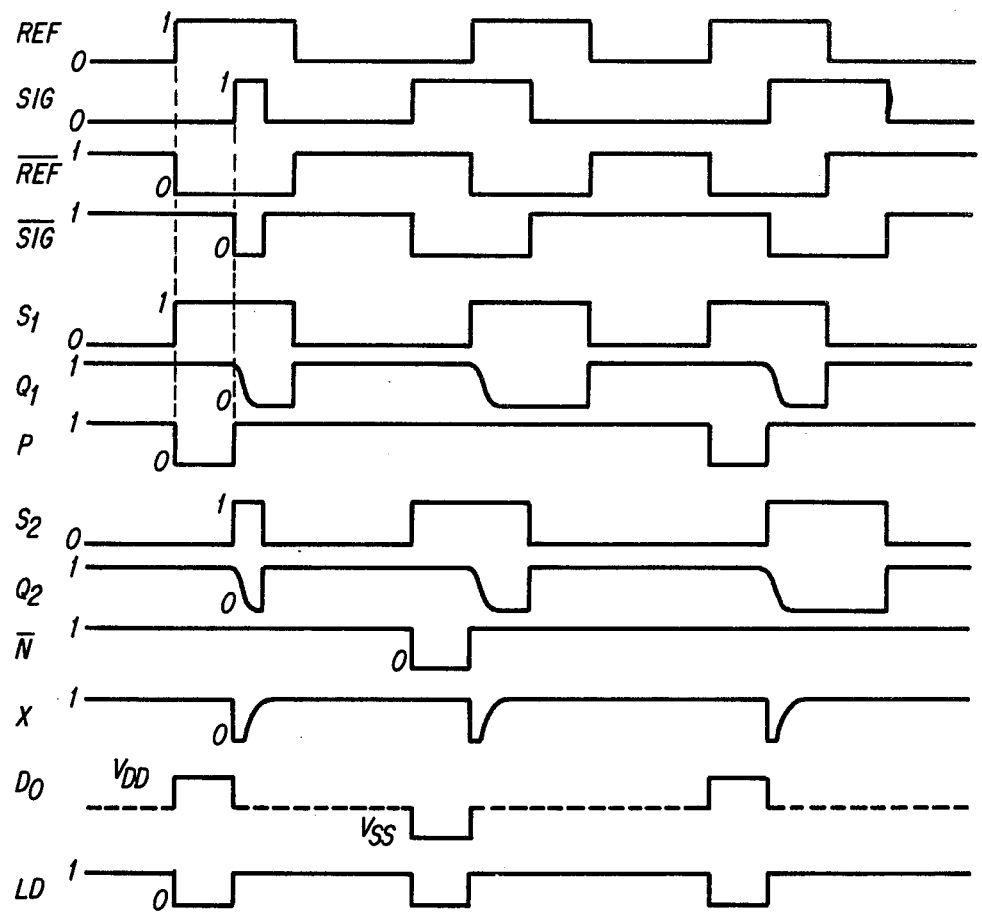
FIG. 3 shows waveforms for illustrating the operation of a conventional phase detector circuit.
Figure 5:
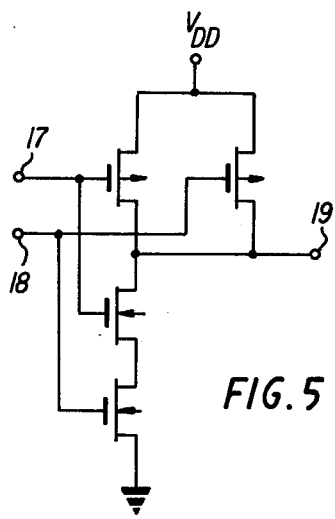
FIG. 5 is a transistor circuit diagram of a NAND gate.

Further, as the output signals N and $\overline{N}$ of the flip-flop circuit (30) are always inverted with respect to each other, an inverse signal of signal N can be obtained directly. So, the inverter (16) in FIG. 2 can be removed. Consequently, the circuit according to this invention is simple.

Another embodiment of the invention is shown in FIG. 13. In this circuit, the function of the NOR gate (31) in FIG. 7 is included in reset dominant R-S type flip-flop circuits (42) and (43). The flip-flop circuits (27) and (29) in FIG. 7 are replaced by the flip-flop circuits (42) and (43) having AND gates at the set input terminals, respectively. The output signals P and N are in parallel and are applied to the AND gates of the flip-flop circuit (42) and (43) in order to set the logic. This circuit has the same function as the circuit in FIG. 7. In FIG. 13, the terminal to which an inverted reset signal is applied is illustrated as $\overline{R}$ and the terminal to which a set signal is applied is illustrated as S.

Figure 14:
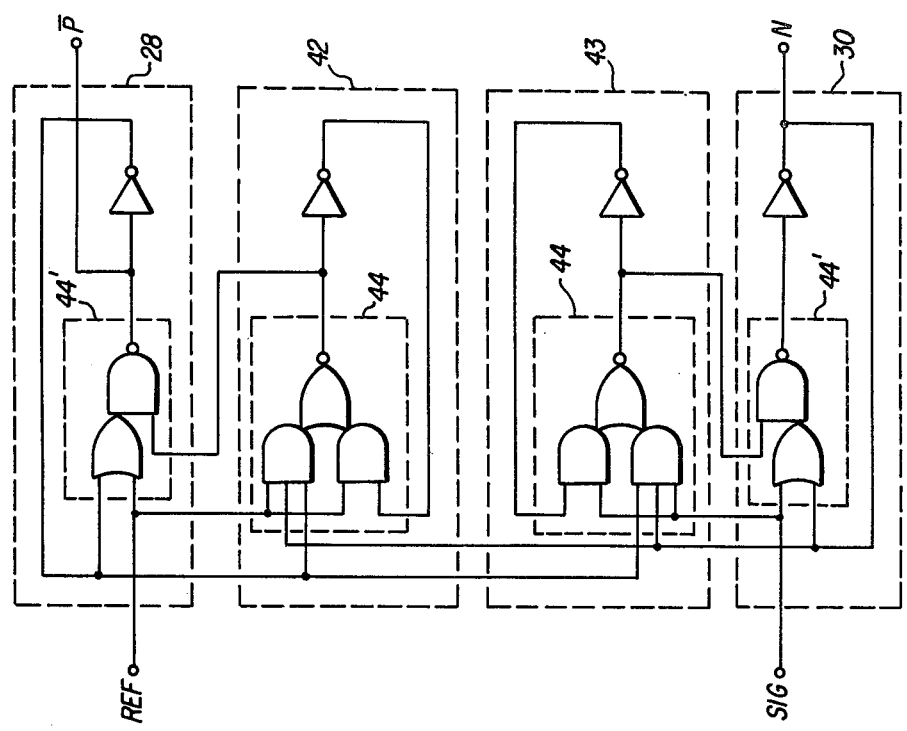
FIG. 14 is a concrete logic diagram of the logic circuit in FIG. 13.
Figure 15:
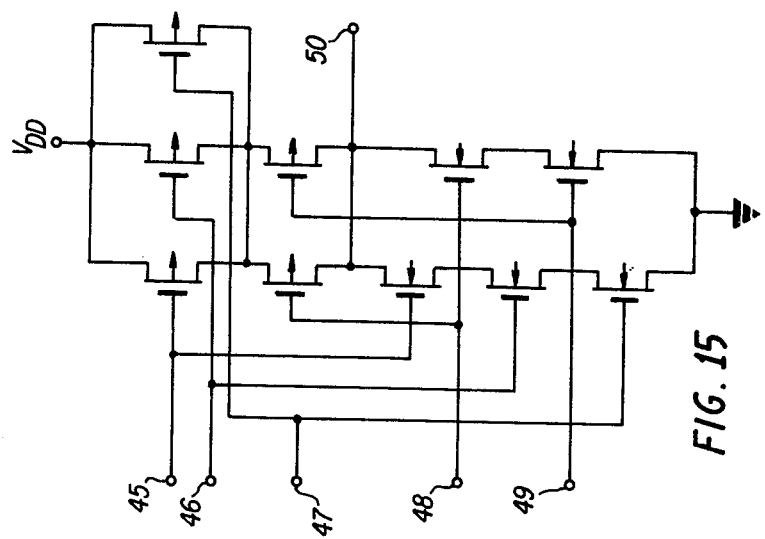
FIG. 15 is a transistor circuit diagram of the logic gate used in the circuit in FIG. 14.

FIG. 14 is a concrete logic diagram of the logic diagram in FIG. 13. Logic gate (44) is constructed by complementary MOS transistors as shown in FIG. 15. In the circuit of FIG. 15, input terminals (45), (46) and (47) are input terminals of the AND gate which have three input terminals, and input terminals (48) and (49) are other input terminals. An output signal is obtained at an output terminal (50).

The logic gate (44') in FIG. 14 can be constructed by the circuit in FIG. 11 and the inverter in FIG. 14 can be constructed by the circuit in FIG. 6. So, the phase detector circuit in FIG. 14 can be constructed of forty transistors. Furthermore, as the signal applied to the logic gate (44) is, in common, applied to the two AND gates, one transistor of the circuit in FIG. 15 can be removed. In this case, two N-channel MOS transistors connected to the common input terminals can be replaced by one N-channel MOS transistor. Thus, the transistors are further decreased in number.

Figure 16:
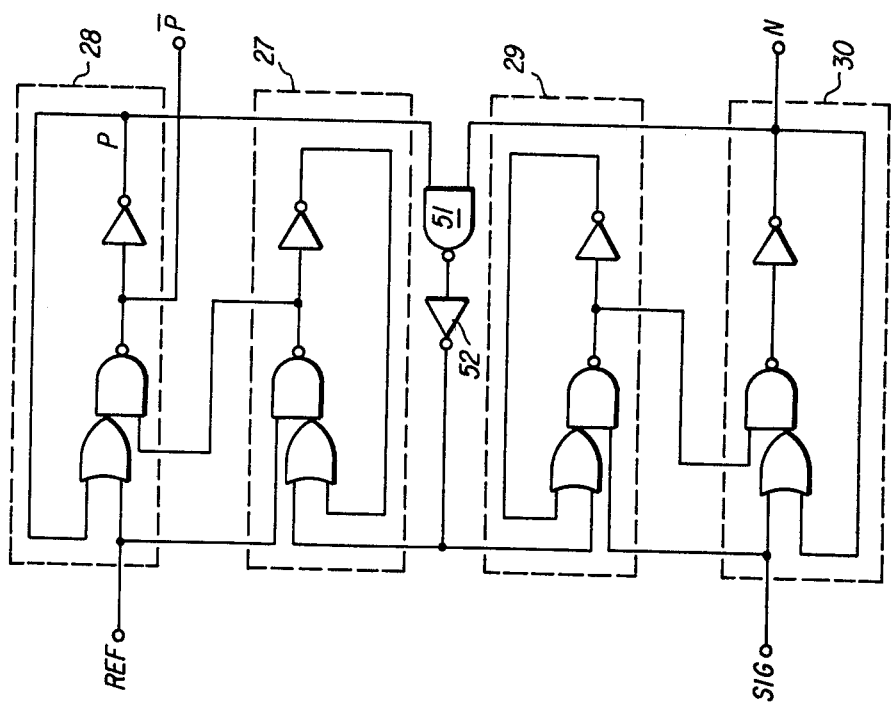
FIG. 16 is a concrete logic diagram of the logic circuit in FIG. 13.

FIG. 16 is another concrete logic diagram of the logic circuit in FIG. 13. In this circuit, the NOR gate (31) in FIG. 10 is replaced by a NAND gate (51) and an inverter (52). As an alternative, the output signals P and N of the flip-flop circuits (28) and (30) are applied to the NAND gate (51), and the output signal of the NAND gate (51) is applied to each set input terminal of the flip-flop circuits (27) and (29) through the inverter (52). This circuit has the same function as the circuit in FIG. 14, and can be constructed of thirty-eight transistors.

Figure 17:
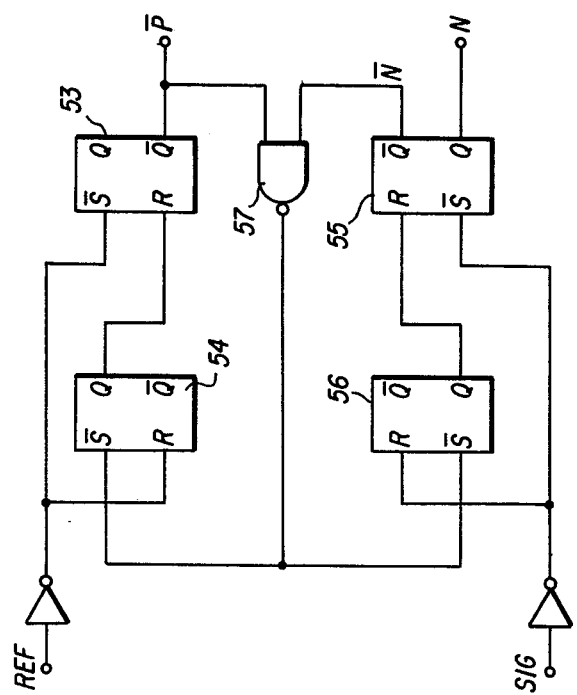
FIG. 17 is a logic diagram of another embodiment of the invention.

FIG. 17 is a third embodiment of this invention. In this circuit, reset dominant R-S type flip-flop circuits (53), (54), (55) and (56) are used and they are set when the set input signal is inverted from "1" level to "0" level. So, after the signals $R_{ef}$ and $S_{ig}$ are inverted, they are, respectively, applied to the flip-flop circuits (53), (54), (55) and (56). The output signals of the flip-flop circuits (54) and (56) are, respectively, applied to the flip-flop circuits (53) and (55). Further, as flip-flop circuits (53), (54), (55) and (56) are used in this circuit, the NOR gate (31) as used in FIG. 7 is replaced by a NAND gate (57). This circuit has the same function as the circuits in FIGS. 7 and 13. In FIG. 17, the input terminal to which the reset input signal is applied is illustrated as R and the input terminal to which the inverted input signal is applied is illustrated as $\overline{S}$.

Figure 18:
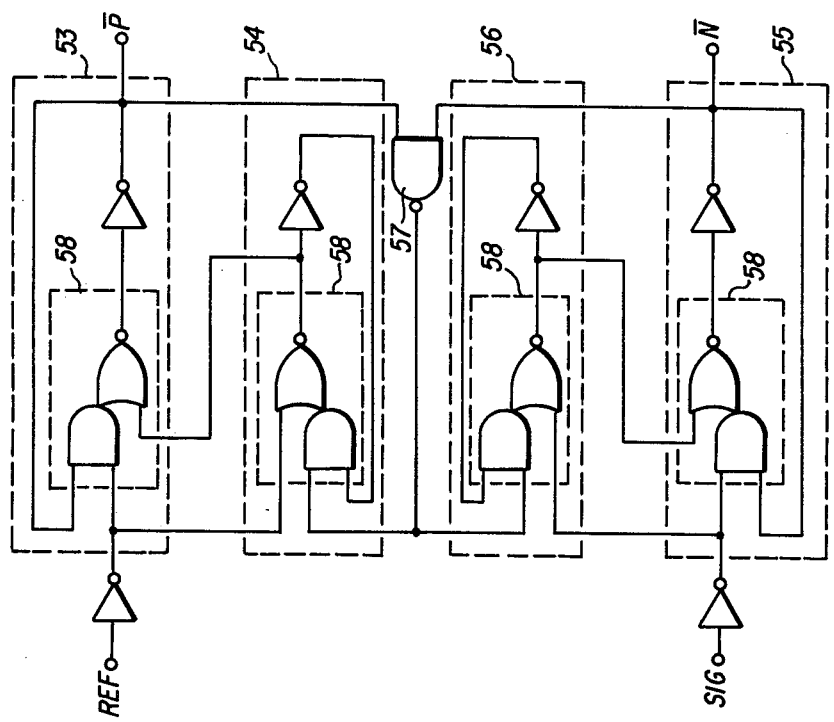
FIG. 18 is a concrete logic diagram of the logic circuit in FIG. 17.
Figure 19:
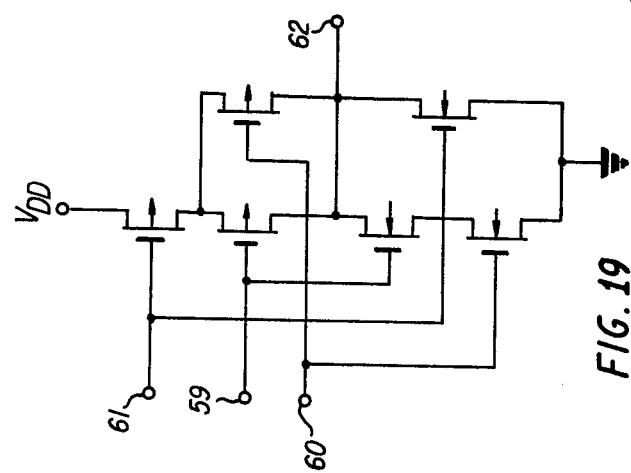
FIG. 19 is a transistor circuit diagram of the logic gate used in the circuit shown in FIG. 18.

A concrete logic diagram of the logic diagram in FIG. 17 is shown in FIG. 18. A logic gate (58) in this circuit is constructed by complementary MOS transistors in FIG. 19. Input terminals (59) and (60) are the input terminals of the AND gate of the logic gate (58) of FIG. 18 and an input terminal (61) is the other input terminal of the NOR gate of the logic gate (58). An output signal is obtained at a terminal (62). So, the circuit in FIG. 18 can be constructed by forty transistors.

Figure 20:
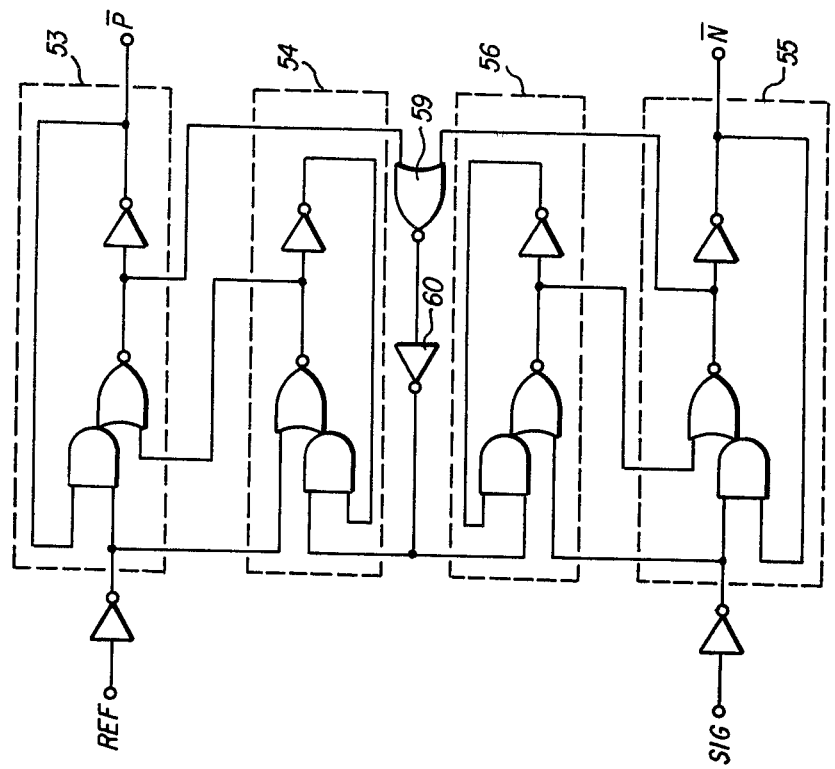
FIG. 20 is another concrete logic diagram of the logic circuit in FIG. 17.

FIG. 20 is another concrete logic diagram of the logic diagram in FIG. 17. In this circuit, the NAND gate (57) in FIG. 17 is replaced by a NOR gate (59) and an inverter (60). The output signals P and N of the flip-flop circuit (53) are applied to the NOR gate (59) and the output signal of the NOR gate (59) is applied through the inverter (60) to the flip-flop circuits (54) and (56) in order to set the logic. The circuit in FIG. 20 is constructed of forty-two transistors.

Figure 21:
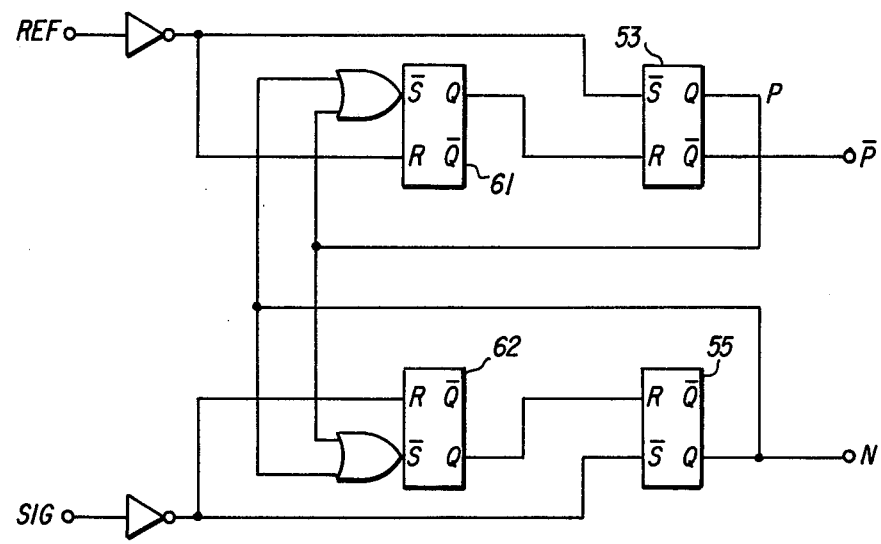
FIG. 21 is a logic diagram of another embodiment of the invention.
Figure 23:
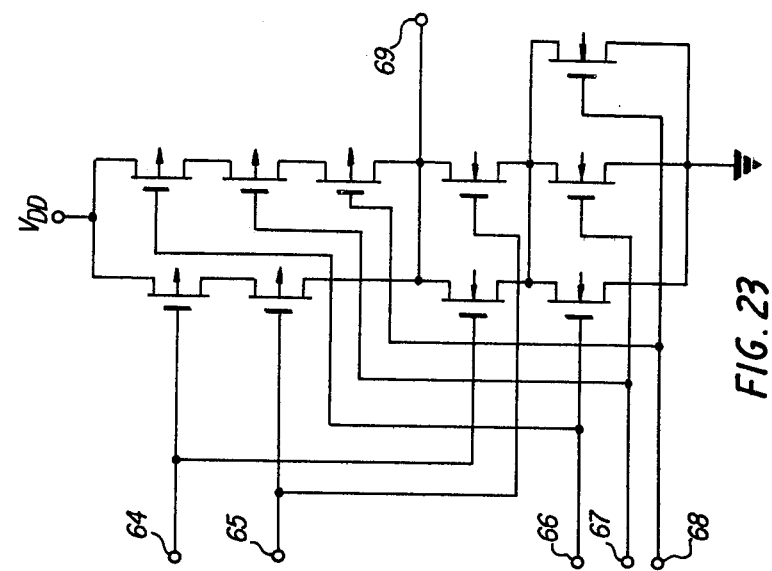
FIG. 23 is a transistor circuit diagram of the logic gate used in the circuit in FIG. 22.
Figure 22:
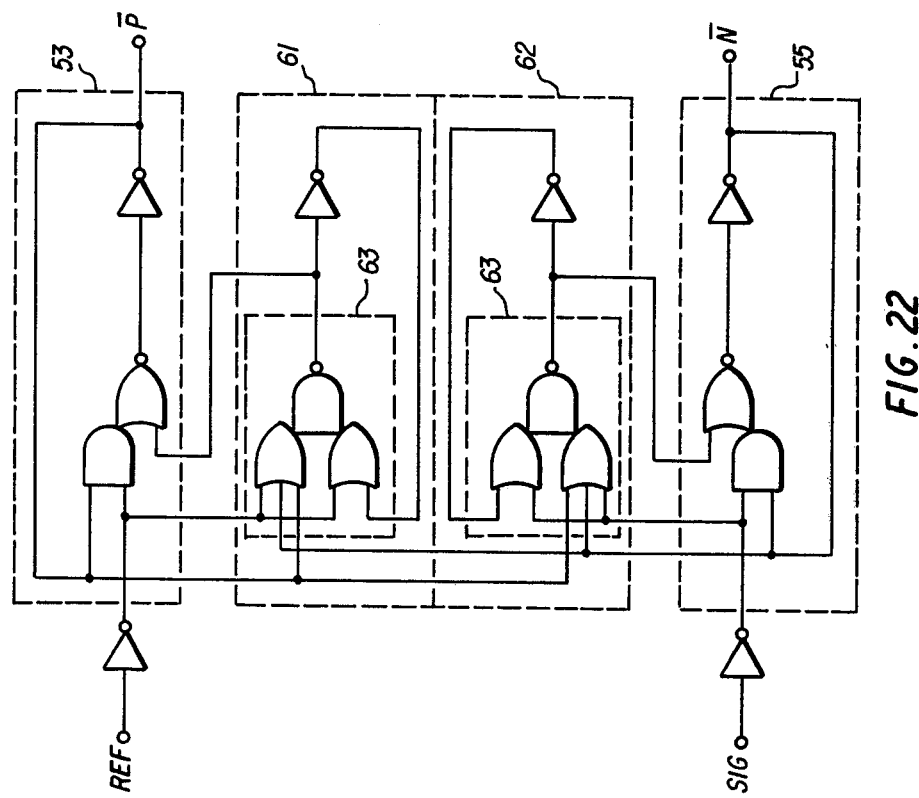
FIG. 22 is a concrete logic diagram of the logic circuit shown in FIG. 21.

A fourth embodiment of the invention is shown in FIG. 21. In this circuit, reset dominant R-S type flip-flop circuits (61) and (62) have the same function as the NAND gate (57) in FIG. 18. The flip-flop circuits (61) and (62), respectively, include an OR gate to which the output signals P and N are applied. The outputs of the OR gates are to the $\overline{S}$ input terminals of flip-flop circuits (61) and (62). This circuit has the same function as the circuits of the previously described first, second and third embodiments. A concrete logic diagram of the logic circuit in FIG. 21 is shown in FIG. 22. A transistor circuit of the logic gate (63) of FIG. 22 is shown in FIG. 23. The transistor circuit is constructed of complementary MOS transistors. In this circuit, the terminals (64) and (65) are input terminals of the OR gate of FIG. 22, which has two input terminals, and the terminals (66), (67) and (68) are input terminals of the OR gate which has three input terminals. An output signal is obtained at an output terminal (69) in response to the input signals. In the above-mentioned circuit of FIG. 22, a total of forty-four transistors is used. As the input signal is commonly applied to two OR gates, one transistor in the circuit of FIG. 23 can be removed. In this case, one P-channel transistor connected to a common input terminal will be removed. So, the transistors can be further decreased in number.

Figure 24:
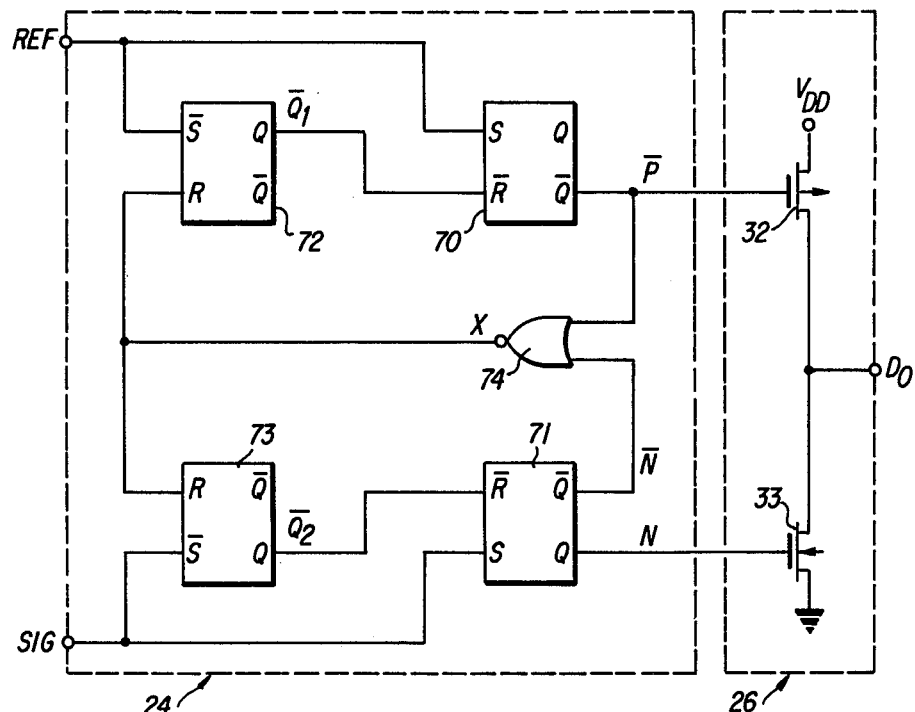
FIG. 24 is a logic diagram of another embodiment of the invention.

The logic diagram of the fifth embodiment of this invention is shown in FIG. 24. All of the flip-flop circuits (70), (71), (72) and (73) in this FIGURE are reset dominant R-S type flip-flop circuits. The truth table for the reset dominant type flip-flop circuit is shown in FIG. 8. In the flip-flop circuits (70) and (71), the set signal and the inverted reset signal are applied to their input terminals, and in the flip-flop circuits (72) and (73), the inverted set signal and the reset signal are applied to their input terminals. The reset input terminal of the flip-flop circuits (70) and (71) is indicated as $\overline{R}$ and the set and reset input terminals of the flip-flop circuits (72) and (73) are, respectively, indicated as $\overline{S}$ and R. Nor gate (74) has two input terminals at which the output signals of the flip-flop circuits (70) and (71) are applied, and the output signal thereof is applied to the flip-flop circuits (72) and (73). The output signals $\overline{P}$ and N of the phase detector circuit (24) are applied to the MOS transistors (32) and (33), respectively. The output signal $D_o$ of the charge pump (26) is at a power supply voltage $V_{DD}$ level during the period when the phase of the signal $S_{ig}$ is delayed in comparison with that of the signal $R_{ef}$, and is at ground level during the period when the phase of the signal $S_{ig}$ is advanced in comparison with that of the signal $R_{ef}$, and is at a high impedance state when the phases of the two signals $R_{ef}$ and $S_{ig}$ are equal.

Figure 25:
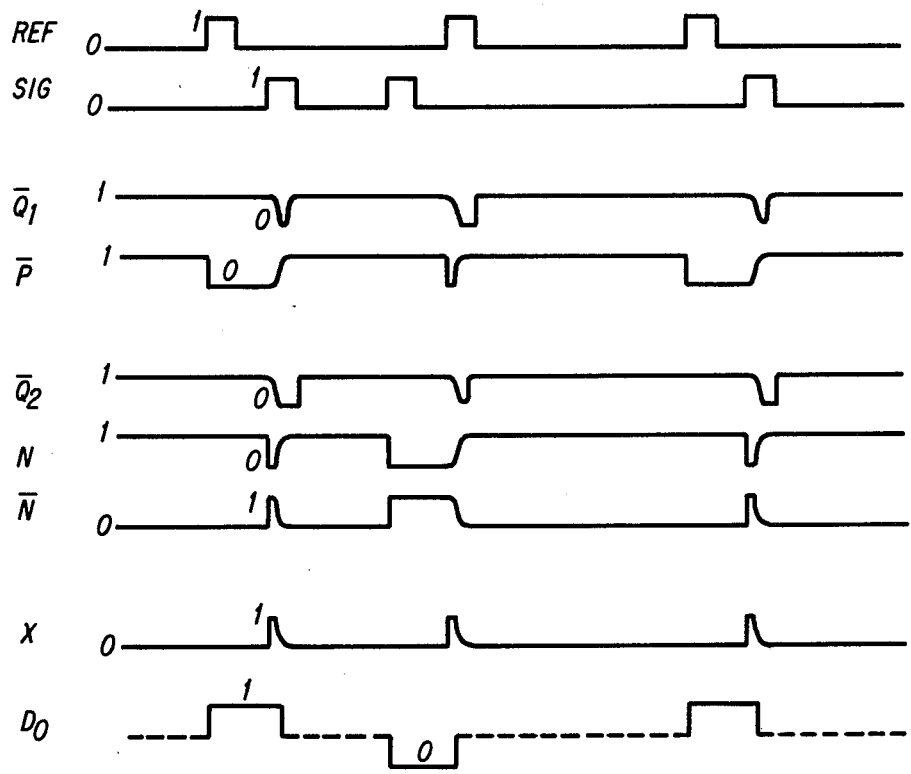
FIG. 25 shows waveforms for illustrating the operation of the circuit in FIG. 24.

The operation of this circuit is explained in connection with the timing chart in FIG. 25, as follows. FIG. 25 shows waveforms as they appear at various points in the circuit of FIG. 24. When the reference signal $R_{ef}$ is changed from "0" level to "1" level, the $\overline{Q}$ output signal $\overline{P}$ is changed from "1" level to "0" level. So, the output signal of the charge pump (26) becomes "1" level. Thereafter, in the instance where the input signal $S_{ig}$ is changed from "0" level to "1" level, the $\overline{Q}$ output signal $\overline{N}$ will rise from "0" level to "1" level. It follows that the output signal X of the NOR gate (74) will rise from "0" level to "1" level. Due to this operation, as the Q output signals $\overline{Q1}$ and $\overline{Q2}$ go down from "1" level to "0" level, the output signal $\overline{P}$ rises from "0" level to "1" level and the output signal N goes from "1" level to "0" level. As the signal $\overline{P}$ is applied to the transistor (32), the transistor will turn off. Accordingly, the signal $D_o$ will be changed to a high impedance state.

When the signal $S_{ig}$ precedes the reference signal $R_{ef}$, the output signal $D_o$ will be changed as shown in FIG. 25. The operation of the circuit in this instance can be readily understood by referring to the above-mentioned explanation.

Figure 26:
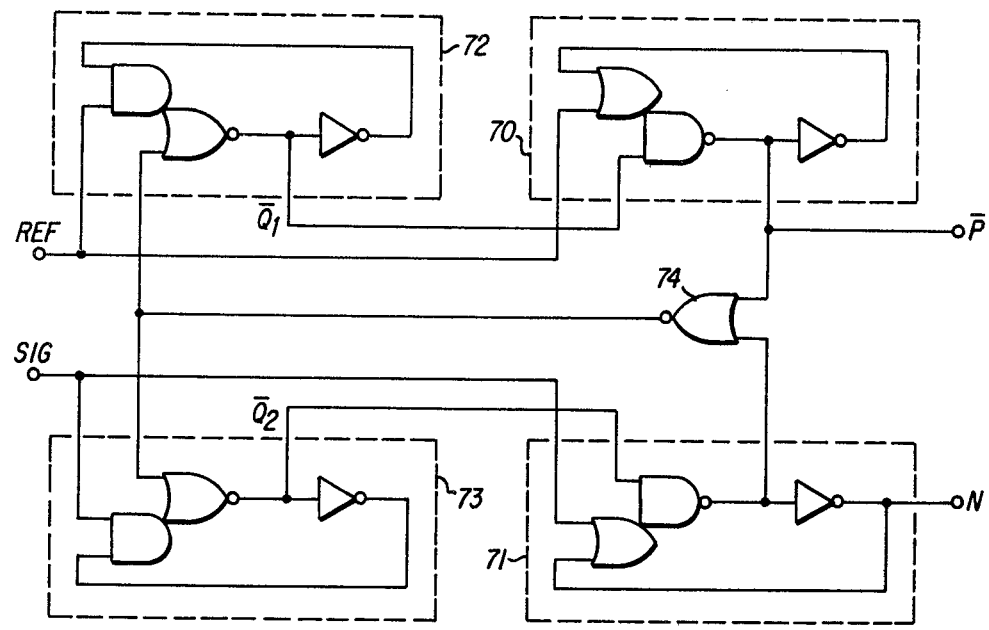
FIG. 26 is a concrete logic diagram of the logic circuit in FIG. 24.

A concrete logic diagram of the circuit (24), in FIG. 24, is shown in FIG. 26. This circuit can be constructed from thirty-six transistors.

Figure 27:
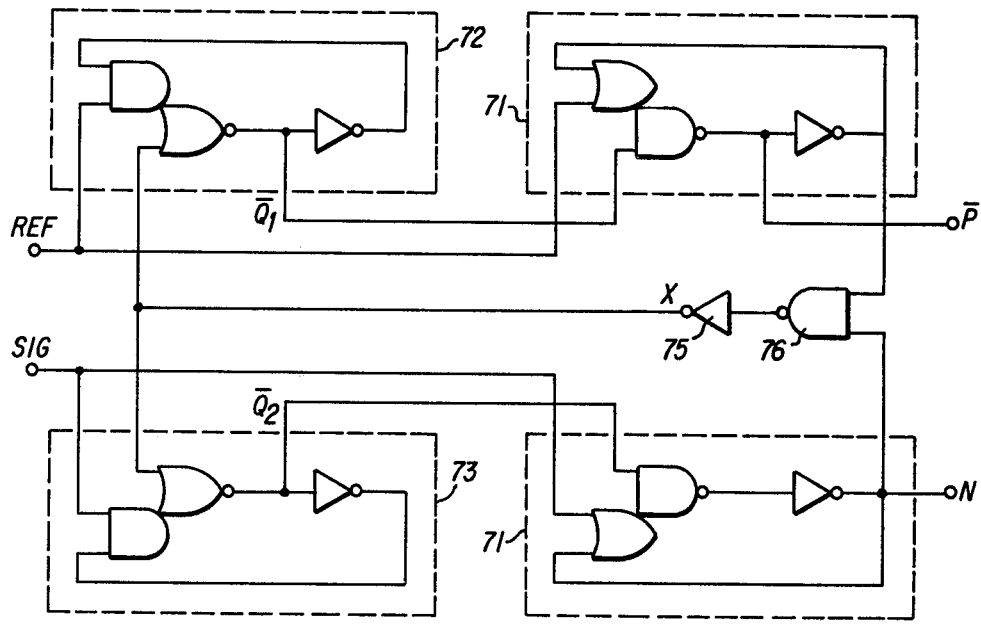
FIG. 27 is another concrete logic diagram of the logic circuit in FIG. 24.

Another concrete logic diagram of the circuit (24), in FIG. 24, is shown in FIG. 27. In this circuit, the NOR gate (74) in FIG. 26 is replaced by an inverter (75) and a NAND gate (76) having two input terminals to which the output signals P and N of the flip-flop circuits (70) and (71) are applied. This circuit can be constructed from thirty-eight transistors.

Figure 28:
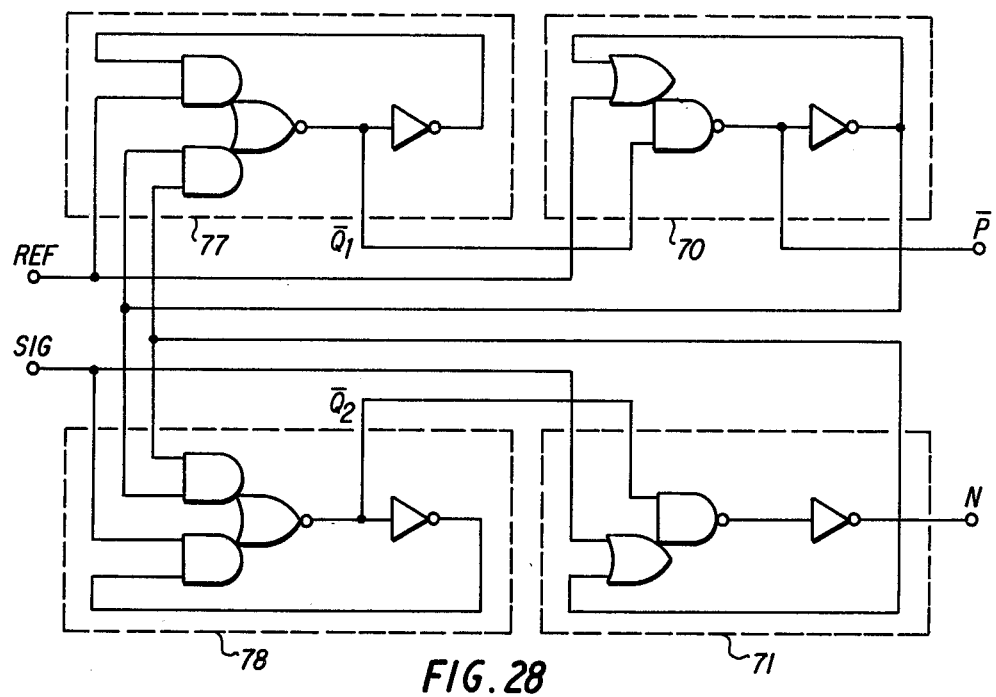
FIG. 28 is still another concrete logic diagram of the logic circuit in FIG. 24.

A further concrete logic diagram of the circuit (24), in FIG. 24, is shown in FIG. 28. In this circuit, the flip-flop circuits (77) and (78) possess the same functions as the NAND gate (76) and the inverter (75) in FIG. 27.

Figure 29:
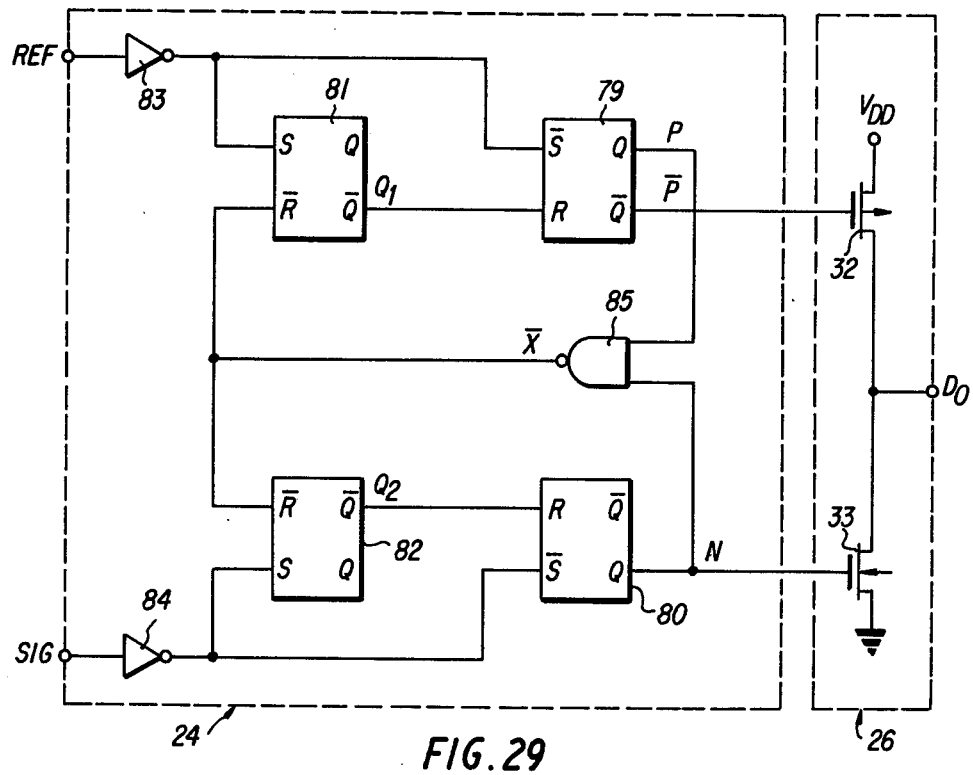
FIG. 29 is a logic diagram of another embodiment of the invention.
Figure 30:
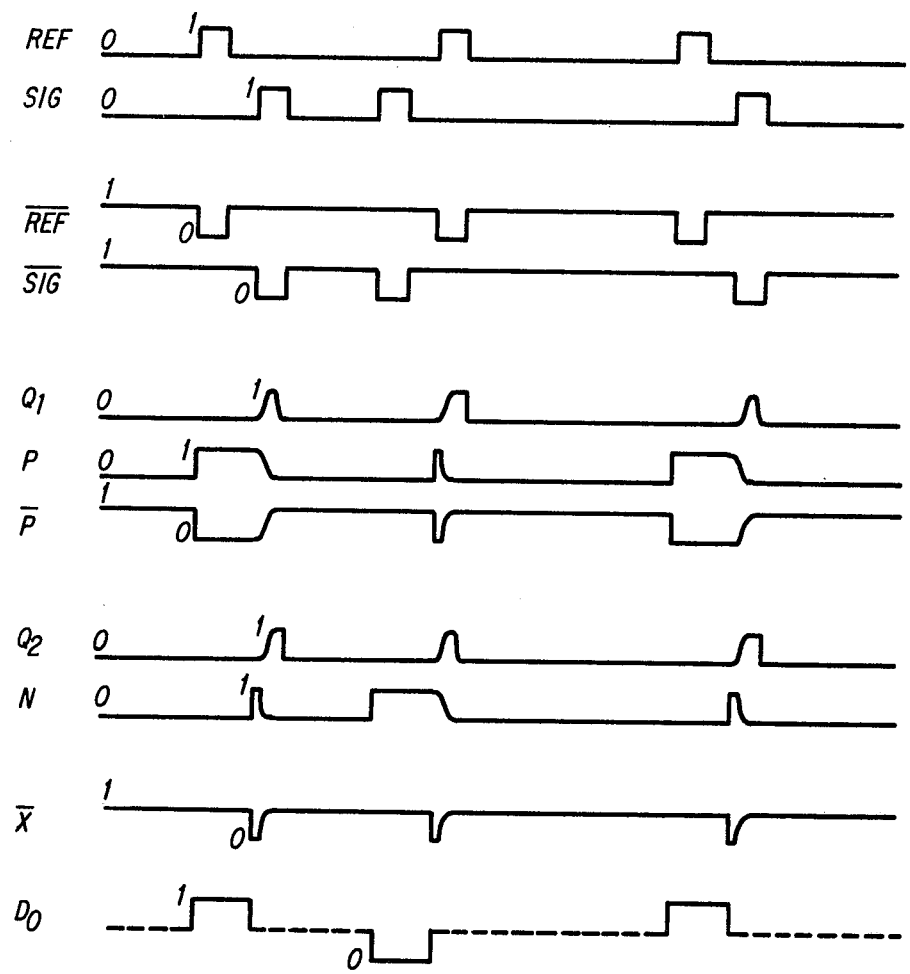
FIG. 30 shows waveforms for illustrating the operation of the circuit in FIG. 29.

The sixth embodiment of this invention is shown in FIG. 29. Flip-flop circuits (79), (80), (81), and (82) are reset dominant R-S type flip-flop circuits. The flip-flop circuits (79) and (80) use "0" level as a set input and "1" level as a reset input. Also the flip-flop circuits (81) and (82) use "1" level as a set input and "0" level as a reset input. So, the set and reset input terminals of the flip-flop circuits (79) and (80) are, respectively, indicated by $\overline{S}$ and R and the set and reset input terminals of the flip-flop circuits (81) and (82) are, respectively, indicated by S and $\overline{R}$. The signals $S_{ig}$ and $R_{ef}$ are inverted by inverters (83) and (84) and are applied to the flip-flop circuits (79), (80), (81) and (82). The Q output signals P and N of the flip-flop circuits (79) and (80) are applied to a NAND gate (85) and the output signal $\overline{X}$ of the NAND gate (85) is applied to the flip-flop circuits (81) and (82), respectively. FIG. 30 shows waveforms for various points in the circuit of FIG. 29.

The situation where the signal $R_{ef}$ is changed from "0" level to "1" level is explained. Then, the output signal P of the flip-flop circuit (79) is changed from "0" level to "1" level and the output signal $\overline{P}$ of the flip-flop circuit (79) is changed from "1" level to "0" level. Therefore, the transistor 32 is on and the output $D_o$ is "1" level. When the signal $S_{ig}$ is changed from "0" level to "1" level, the output signal N of the flip-flop circuit (80) will be changed from "0" level to "1" level. The output signal $\overline{X}$ of the NAND gate (85) is changed from "1" level to "0" level. When the signal $\overline{X}$ became "0" level, the output signals Q₁ and Q₂ of the flip-flop circuits (81) and (82) set the output $\overline{P}$ at "1" level and the output N at "1" level. Therefore, the transistor 32 is on and the output $D_o$ turns to a high impedance state. As the series of operations is completed in a moment, the transistor (33) doesn't turn to ON state.

When the signal $S_{ig}$ goes ahead of or precedes the signal $R_{ef}$, the operation of the circuit (24), in FIG. (24), will be easily expected by the above-mentioned explanation.

Figure 31:
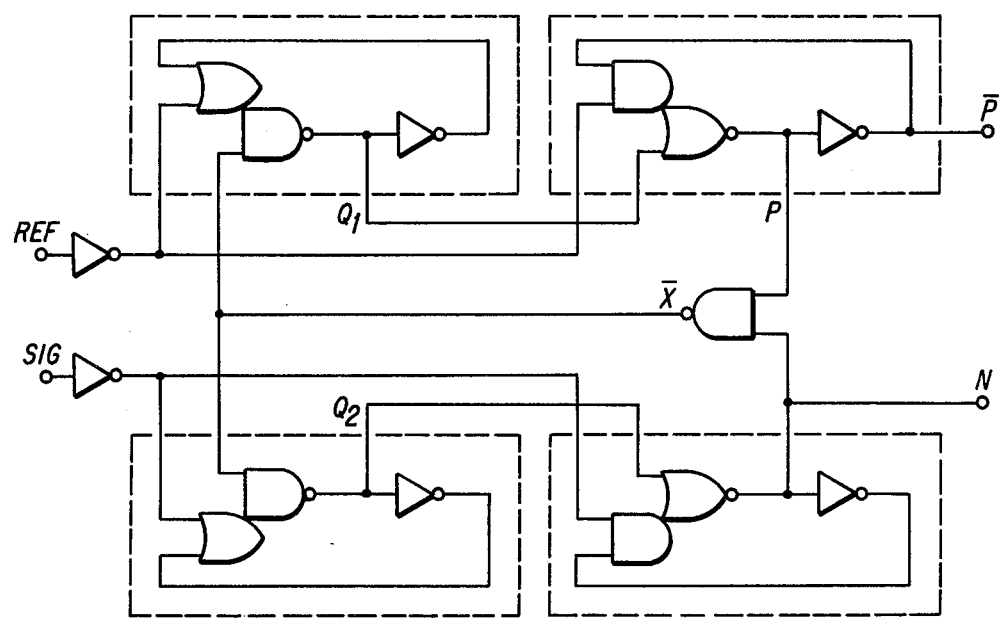
FIGS. 31 and 32 are concrete logic diagrams of the logic circuit shown in FIG. 29.
Figure 32:
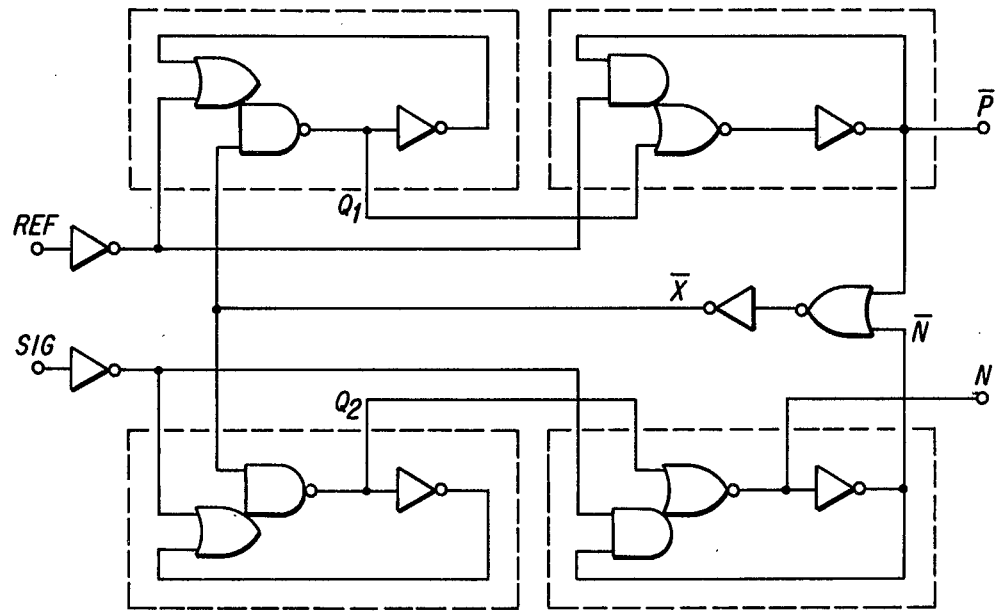

Concrete logic diagrams of the circuit in FIG. 29 are shown in FIGS. 31 and 32. These circuits are, respectively, constructed by forty and forty-two transistors.

Figure 4:
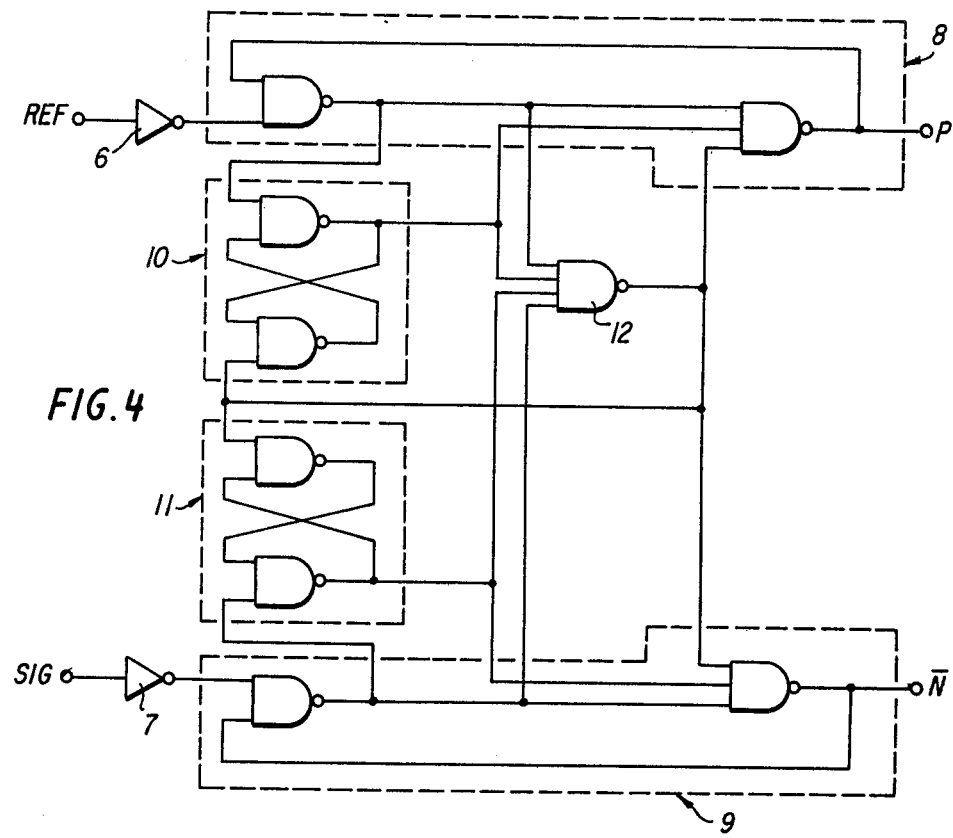
FIG. 4 is a concrete logic diagram of a conventional phase detector circuit.
Figure 33:
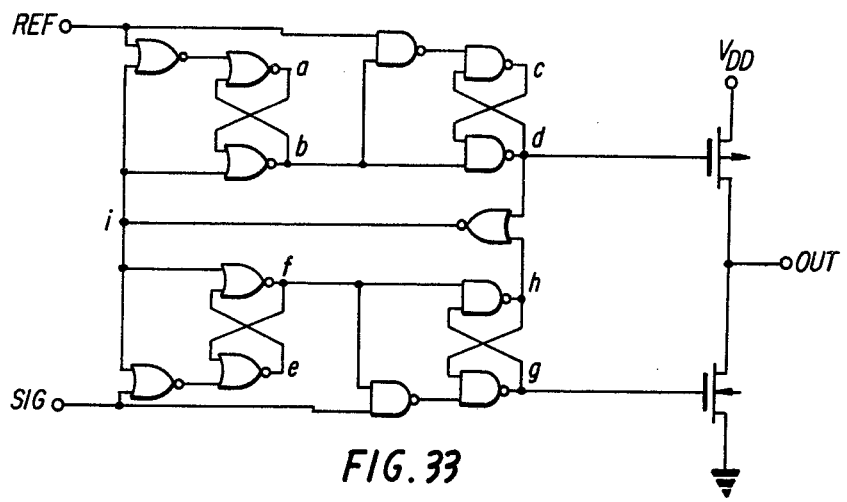
FIG. 33 is a logic diagram of another embodiment of the invention.
Figure 34:
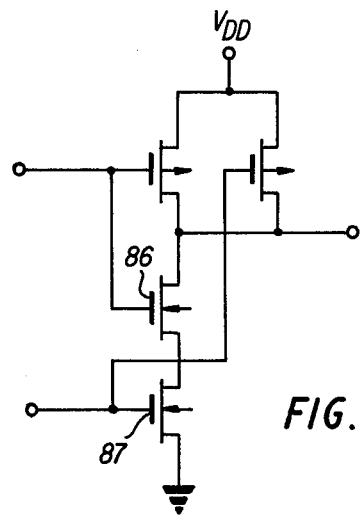
FIG. 34 shows waveforms for illustrating the operation of the circuit in FIG. 33.
Figure 35:
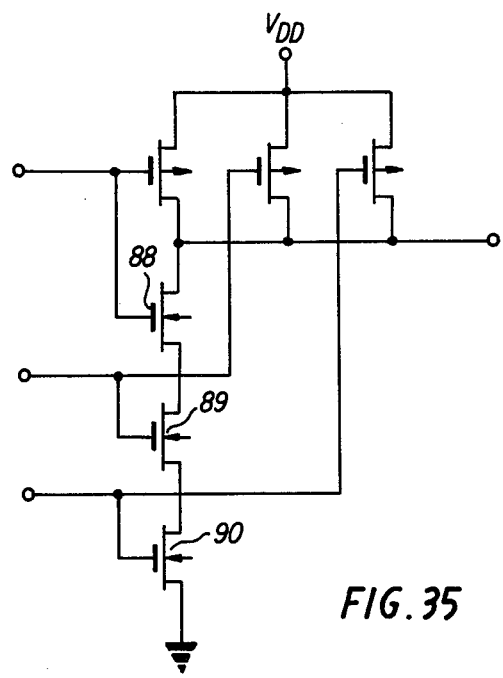
FIG. 35 is a logic diagram of another embodiment of the invention.

The seventh embodiment of this invention is shown in FIG. 33. This circuit is constructed by only logic gates having two input terminals. Generally, as the input terminals increase in number, the difference in circuit threshold voltage between input signals also increases. This is explained as follows. FIG. 34 is a transistor circuit diagram of a NAND gate having two input terminals and FIG. 35 is a transistor circuit diagram of a NAND gate having three input terminals. The circuits in FIGS. (34) and (35) are constructed by complementary MOS transistors. The transistors (86), (87), (88), (89) and (90) will be on if at least the following voltages are applied to their gates:

transistor 86; $V_{th} + V_{DS}$ (86)
transistor 87; $V_{th}$
transistor 88; $V_{th} + V_{DS}$ (89) + $V_{DS}$ (90)
transistor 89; $V_{th} + V_{DS}$ (90)
transistor 90; $V_{th}$ where $V_{th}$ is the threshold voltage of the transistor and $V_{DS}$ is the source-drain voltage of the transistor at the saturation state. Thus, in the NAND gate having three input terminals, the difference in circuit threshold voltage between input signals is large. So, the higher voltage must be applied to the gate of the transistor in order to set the transistor on. These conditions are taken into consideration during design of the circuit. So, the power supply and the transistor used in the circuit are restricted by these conditions. The prior circuit in FIG. 4 can be constructed by only logic gate having two input terminals, but in that case, the circuit is more complex and the logic gate increases further in number.

Figure 36:
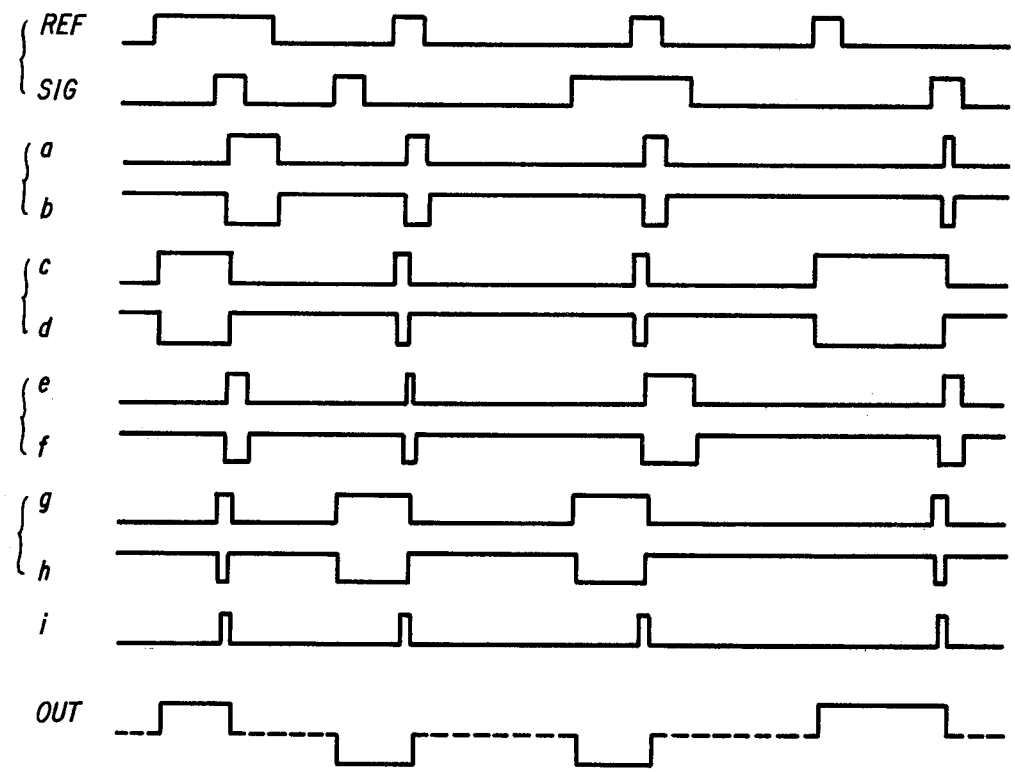
FIG. 36 shows waveforms for illustrating the operation of the circuit is

The circuit in FIG. 33 is constructed by six NAND gates and seven NOR gates. The flip-flop circuits in this circuit are reset dominant R-S type flip-flop circuits. The operation of this circuit can be understood from the waveforms shown in FIG. 36. The operation thereof is essentially the same as that of the circuit in FIG. 24. FIG. 36 shows waveforms for various points in the circuit of FIG. 33.

Figure 37:
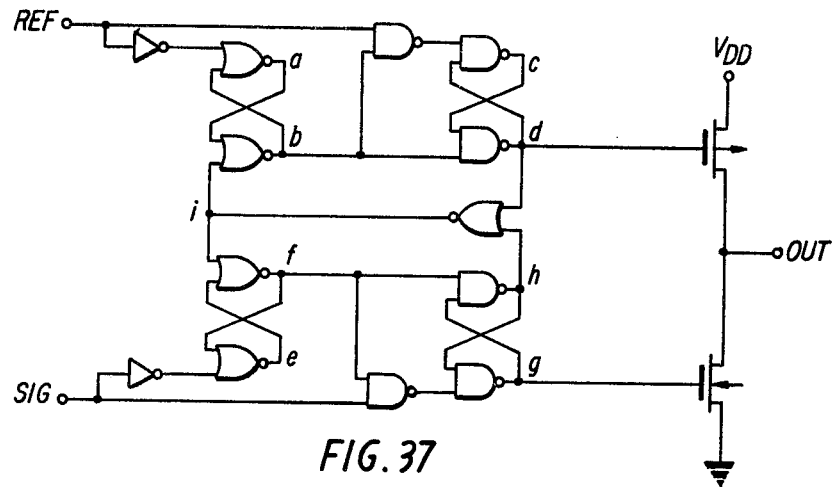
Figure 38:
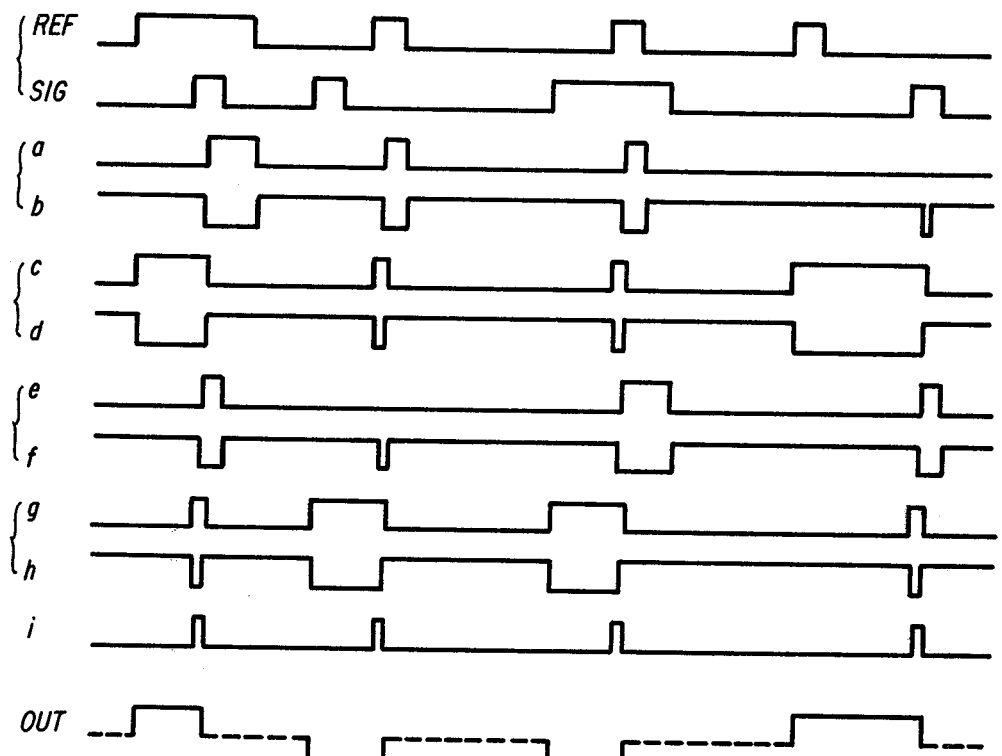

The other embodiment of this invention is shown in FIG. 37. In this circuit, the NOR gates in FIG. 33, to which the signals $R_{ef}$ and $S_{ig}$ are applied, are replaced by inverters, respectively. The flip-flop circuit for obtaining the signals b and f isn't a dominant R-S type flip-flop circuit but is a normal R-S type flip-flop circuit. The operation of the circuit in FIG. 37 is essentially the same in operation as that of the circuit in FIG. 33, and can be understood by referring to the waveforms in FIG. 38. FIG. 38 shows waveforms for various points in the circuit of FIG. 37.

Figure 39:
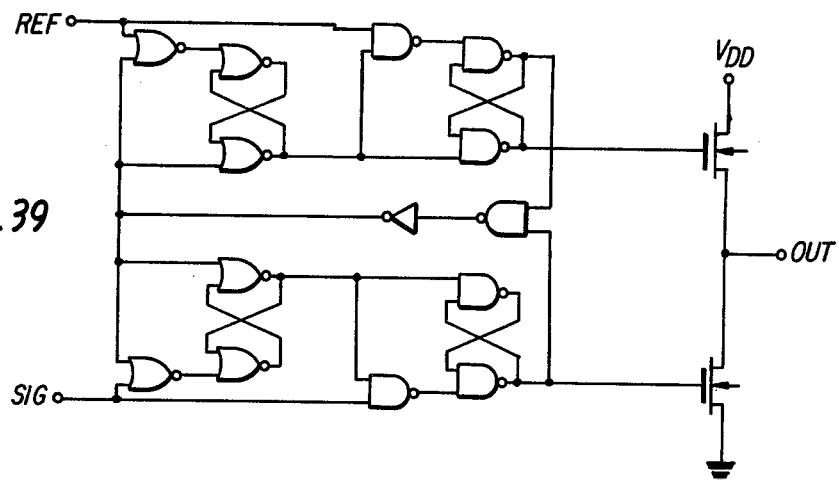
Figure 40:
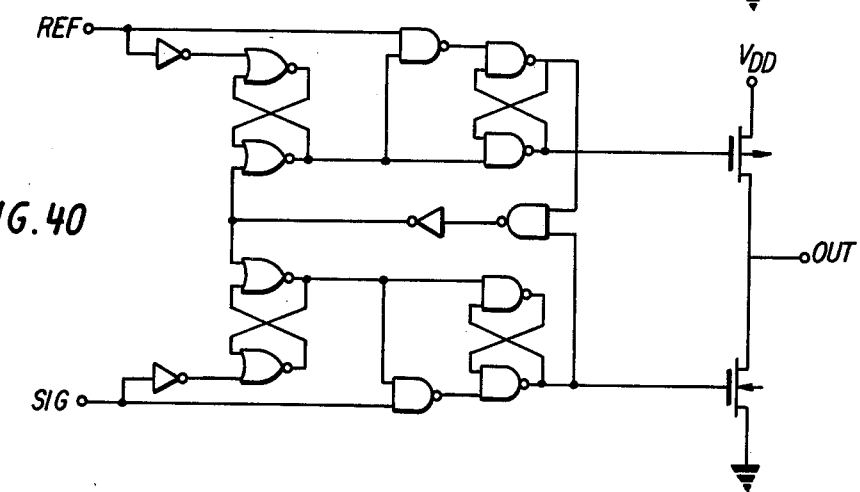
Figure 41:
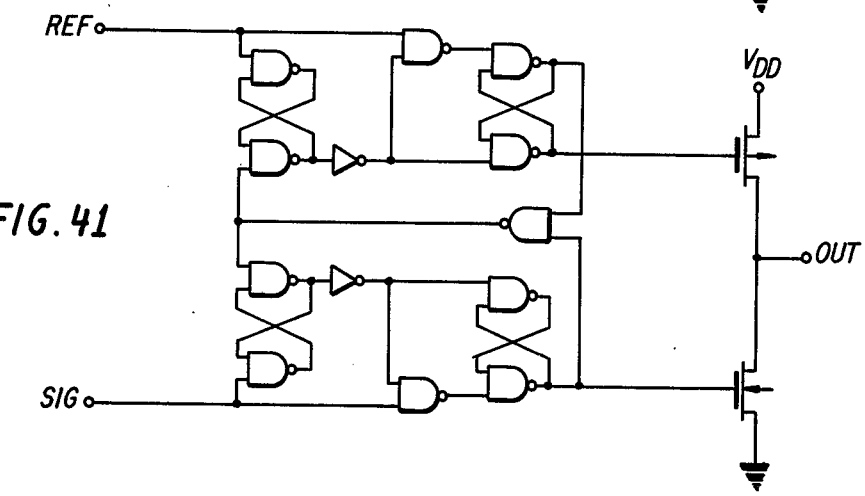

Another embodiment of this invention is shown in FIG. 39. This circuit has the same function as the circuit in FIG. 33. In the circuit shown in FIG. 40, the flip-flop circuits used in FIG. 39 are replaced by normal R-S flip-flop circuits. In FIG. 41, the logic gates of the circuit in FIG. 40 are changed to other logic gates. This circuit has the same function as the circuit in FIG. 40.

Figure 42:
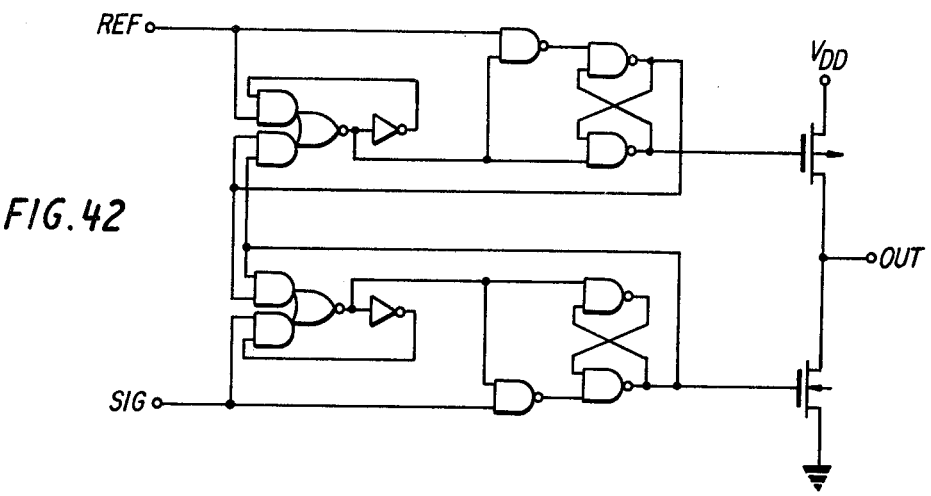
Figure 43:
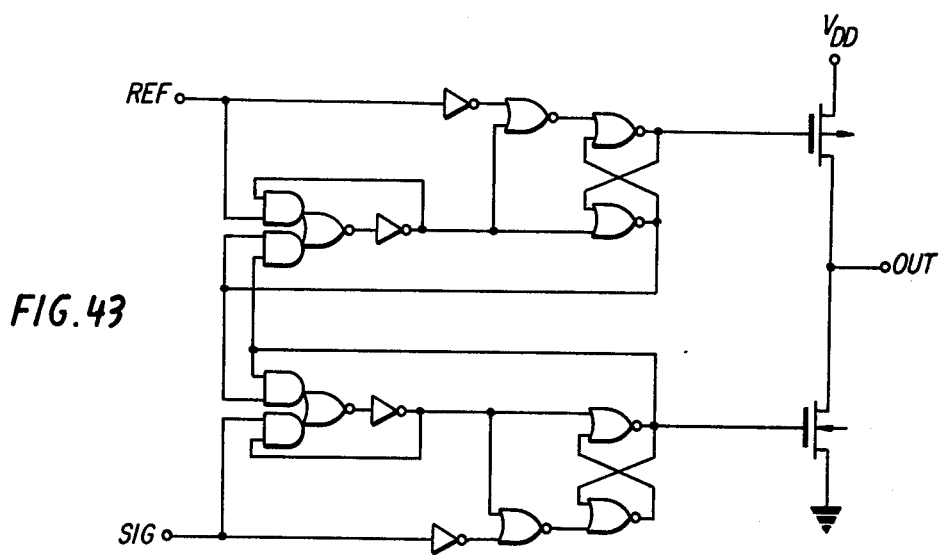

The circuits in FIGS. 42 and 43 are circuits wherein the logic gates of the circuit in FIG. 28 are replaced by logic gates having two inputs. The circuits in FIGS. 42 and 43 have the same function as the circuit in FIG. 28.

Figure 44:
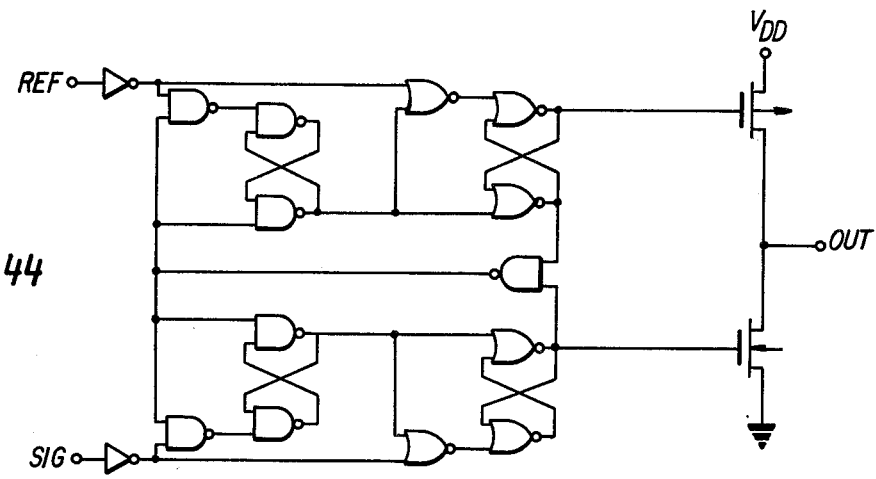
Figure 45:
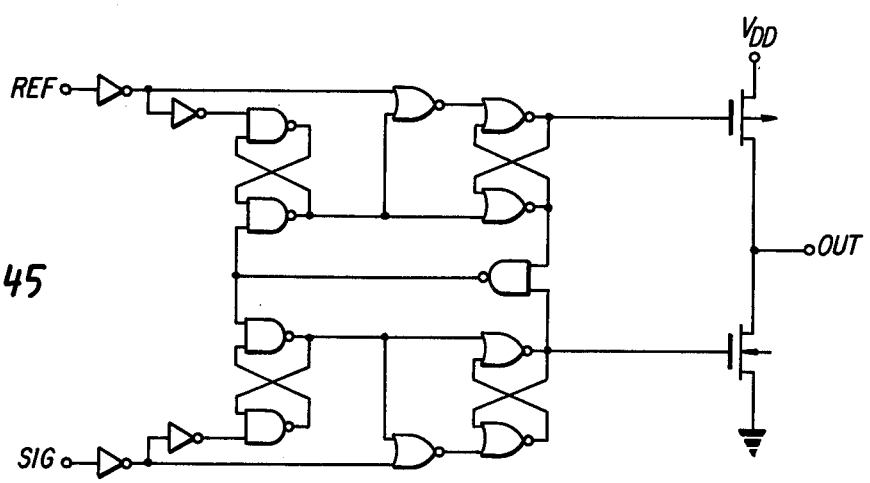
Figure 46:
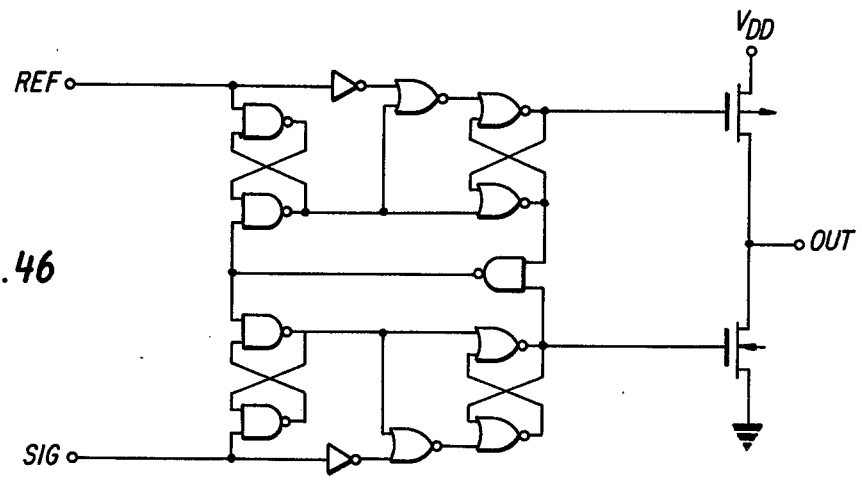

The circuits in FIGS. 44, 45 and 46 are circuits wherein the logic gates of the circuit in FIG. 31 are replaced by logic gates having two inputs.

Figure 47:
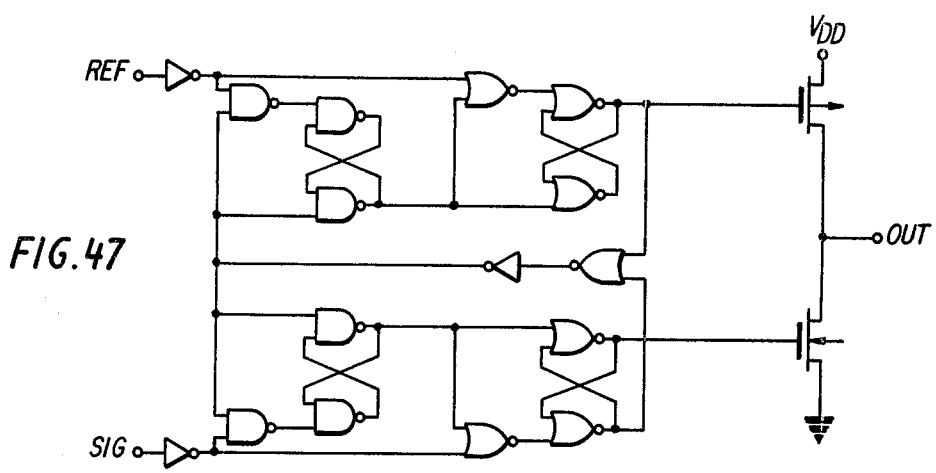
Figure 48:
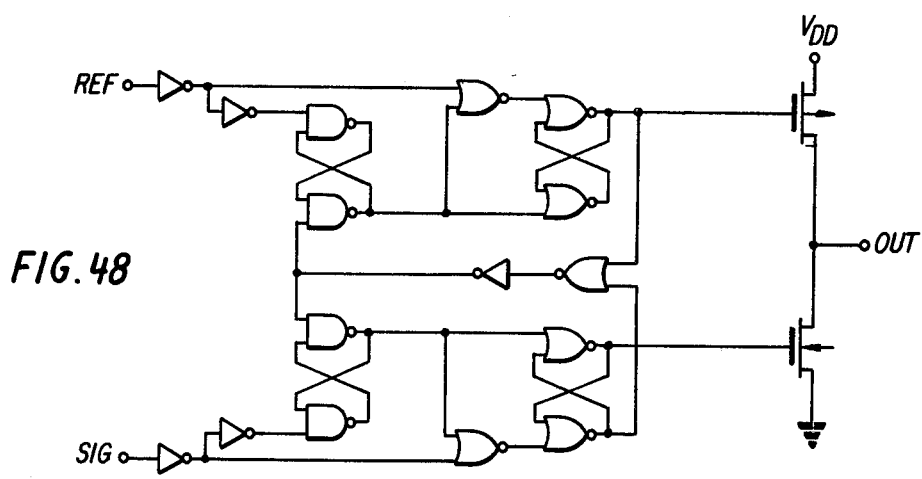
Figure 49:
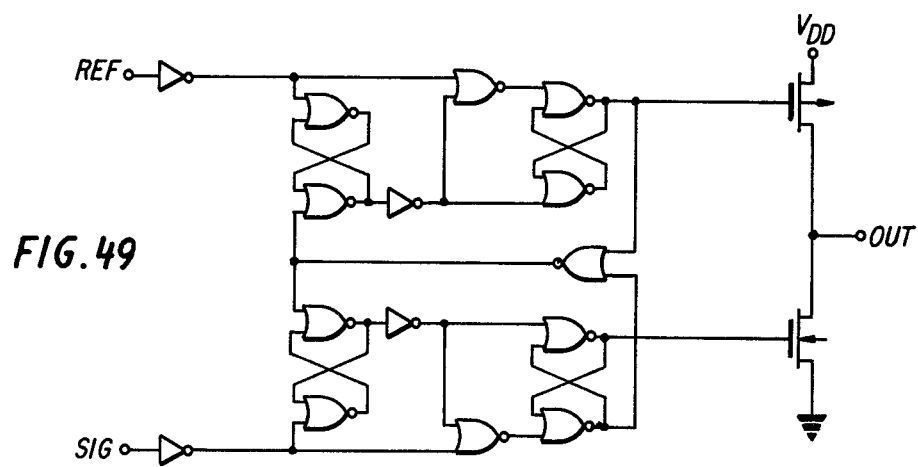

The circuits in FIGS. 47, 48 and 49 are circuits wherein the logic gates of the circuit in FIG. 32 are replaced by logic gates having two inputs.

The circuits in the above-mentioned embodiments include reset dominant type flip-flop circuits but can be constructed from set dominant type flip-flop circuits.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A phase detector circuit comprising:
   two input terminals at which input signals are applied;
   two output terminals at which output signals relative to the phases of the input signals are produced;
   a first dominant type flip-flop circuit connected to one input terminal and whose output signal is transferred to one output terminal;
   a second dominant type flip-flop circuit connected to the other input terminal and whose output signal is transferred to the other output terminal;
   a third flip-flop circuit connected to one input terminal and whose output signal is transferred to the first dominant type flip-flop circuit;
   a fourth flip-flop circuit connected to the other input terminal and whose output signal is transferred to the second dominant type flip-flop circuit;
   gate means for receiving the output signals of the first and second dominant type flip-flop circuits and whose output signal is applied to the third and fourth flip-flop circuits.

2. A phase detector circuit according to claim 1 wherein said third and fourth flip-flop circuits are dominant type flip-flop circuits.

3. A phase detector circuit according to claim 2 wherein said first, second, third and fourth flip-flop circuits are reset dominant type flip-flop circuits.

4. A phase detector circuit according to claim 1 or 2 wherein said third and fourth flip-flop circuits are, respectively, provided with said gate means.

5. A phase detector circuit according to claim 1, 2 or 3 wherein said first, second, third and fourth flip-flop circuits and said gate means are constructed from inverters and logic gates having two input terminals.

* * * * *